(12) United States Patent
Kurooka et al.

(10) Patent No.: US 10,530,383 B2
(45) Date of Patent: Jan. 7, 2020

(54) SEMICONDUCTOR DEVICE

(71) Applicant: Renesas Electronics Corporation, Koutou-ku, Tokyo (JP)

(72) Inventors: Kazuaki Kurooka, Tokyo (JP); Yoshihiro Funato, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/031,872

(22) Filed: Jul. 10, 2018

(65) Prior Publication Data

US 2018/0323797 A1 Nov. 8, 2018

Related U.S. Application Data

(62) Division of application No. 14/991,978, filed on Jan. 10, 2016, now Pat. No. 10,033,397.

(30) Foreign Application Priority Data

Jan. 29, 2015 (JP) ................................. 2015-015618

(51) Int. Cl.
*H03M 1/48* (2006.01)
*H03M 1/64* (2006.01)
*H03M 1/08* (2006.01)

(52) U.S. Cl.
CPC ......... *H03M 1/485* (2013.01); *H03M 1/0872* (2013.01); *H03M 1/645* (2013.01)

(58) Field of Classification Search
CPC ..... H02M 1/485; H02M 1/0872; H02M 1/645
USPC ........................................................ 318/661
See application file for complete search history.

(56) References Cited

U.S. PATENT DOCUMENTS

| 3,516,084 A | 6/1970 | Sacks et al. |
| 3,594,783 A | 7/1971 | Bullock |
| 3,713,141 A | 1/1973 | Higgins et al. |
| 3,843,877 A | 10/1974 | Roselle et al. |
| 4,149,260 A | 4/1979 | Loper, Jr. |

(Continued)

FOREIGN PATENT DOCUMENTS

| EP | 0 333 070 A2 | 9/1989 |
| JP | 03-75522 A | 3/1991 |

(Continued)

OTHER PUBLICATIONS

Office Action dated Oct. 23, 2018, in Japanese Patent Application No. 2015-015618.

(Continued)

*Primary Examiner* — Kawing Chan
(74) *Attorney, Agent, or Firm* — Shapiro, Gabor and Rosenberger, PLLC

(57) ABSTRACT

In a semiconductor device, a sine wave signal is input to a first input part and a cosine wave signal is input to a second input part. A multiplexer alternately selects one of the sine wave signal and the cosine wave signal. An analog to digital converter converts the output signal of the multiplexer into a digital value. A switching circuit is coupled between at least one of the first and second input parts and the multiplexer. The switching circuit is configured to be able to invert the input sine wave signal or the input cosine wave signal, in order to reduce the angle detection error due to the non-linearity error of the A/D converter.

2 Claims, 19 Drawing Sheets

(56) References Cited

U.S. PATENT DOCUMENTS

| | | | |
|---|---|---|---|
| 4,281,316 A | 7/1981 | Simon et al. | |
| 4,334,179 A | 6/1982 | Grimes et al. | |
| 4,556,885 A | 12/1985 | Kurosawa | |
| 4,594,540 A | 6/1986 | Currie et al. | |
| 6,525,502 B1 | 2/2003 | Piedl et al. | |
| 7,352,305 B2 | 4/2008 | Kiriyama et al. | |
| 9,182,251 B2 | 11/2015 | Shinohara | |
| 2005/0030010 A1 | 2/2005 | Jones et al. | |
| 2005/0140329 A1* | 6/2005 | Ihm | H02P 21/06 318/712 |
| 2010/0097052 A1 | 4/2010 | Lillestolen et al. | |
| 2015/0330812 A1 | 11/2015 | Hourne | |

FOREIGN PATENT DOCUMENTS

| | | |
|---|---|---|
| JP | 2004-309285 A | 11/2004 |
| JP | 2011-257254 A | 12/2011 |
| JP | 2013-200141 A | 10/2013 |

OTHER PUBLICATIONS

Extended European Search Report dated Jul. 7, 2016, in European Patent Application No. EP16153378.1.
Office Action dated Mar. 22, 2019, in Chinese Patent Application No. 201610036818.8.

* cited by examiner

FIG. 5

| DIGITAL ANGLE OUTPUT φ | SINE WAVE SWITCHING SIGNAL |
|---|---|
| 0° TO 90° (FIRST QUADRANT) | NON-INVERTED (0) |
| 90° TO 180° (SECOND QUADRANT) | INVERTED (1) |
| 180° TO 270° (THIRD QUADRANT) | NON-INVERTED (0) |
| 270° TO 360° (FOURTH QUADRANT) | INVERTED (1) |

| DIGITAL ANGLE OUTPUT φ | SINE WAVE SWITCHING SIGNAL | COSINE WAVE SWITCHING SIGNAL |
|---|---|---|
| 0° TO 90° (FIRST QUADRANT) | NON-INVERTED (0) | NON-INVERTED (0) |
| 90° TO 180° (SECOND QUADRANT) | NON-INVERTED (0) | INVERTED (1) |
| 180° TO 270° (THIRD QUADRANT) | INVERTED (1) | INVERTED (1) |
| 270° TO 360° (FOURTH QUADRANT) | INVERTED (1) | NON-INVERTED (0) |

| DIGITAL ANGLE OUTPUT φ | SINE WAVE SWITCHING SIGNAL | COSINE WAVE SWITCHING SIGNAL |
|---|---|---|
| 0° TO 90° (FIRST QUADRANT) | INVERTED (1) | INVERTED (1) |
| 90° TO 180° (SECOND QUADRANT) | INVERTED (1) | NON-INVERTED (0) |
| 180° TO 270° (THIRD QUADRANT) | NON-INVERTED (0) | NON-INVERTED (0) |
| 270° TO 360° (FOURTH QUADRANT) | NON-INVERTED (0) | INVERTED (1) |

FIG. 18

| INPUT | | OUTPUT |
|---|---|---|
| DELAYED SWITCHING SIGNAL | DIGITAL ANGLE OUTPUT φ | SINE WAVE SWITCHING SIGNAL |
| INVERTED (1) | 0° + hys TO 90° − hys | NON-INVERTED (0) |
| INVERTED (1) | 90° − hys TO 180° + hys | INVERTED (1) |
| INVERTED (1) | 180° + hys TO 270° − hys | NON-INVERTED (0) |
| INVERTED (1) | 270° − hys TO 0° + hys | INVERTED (1) |
| NON-INVERTED (0) | 360° − hys TO 90° + hys | NON-INVERTED (0) |
| NON-INVERTED (0) | 90° + hys TO 180° − hys | INVERTED (1) |
| NON-INVERTED (0) | 180° − hys TO 270° + hys | NON-INVERTED (0) |
| NON-INVERTED (0) | 270° + hys TO 360° − hys | INVERTED (1) |

FIG. 21A

SINE WAVE ANGLE RANGE DETERMINATION CIRCUIT

| INPUT | | OUTPUT |
|---|---|---|
| SINE WAVE DELAYED SWITCHING SIGNAL | DIGITAL ANGLE OUTPUT $\phi$ | SINE WAVE SWITCHING SIGNAL |
| NON-INVERTED (0) | 360° − hys TO 180° + hys | NON-INVERTED (0) |
| NON-INVERTED (0) | 180° + hys TO 360° − hys | INVERTED (1) |
| INVERTED (1) | 180° − hys TO 0° + hys | INVERTED (1) |
| INVERTED (1) | 0° + hys TO 180° − hys | NON-INVERTED (0) |

FIG. 21B

COSINE WAVE ANGLE RANGE DETERMINATION CIRCUIT

| INPUT | | OUTPUT |
|---|---|---|
| COSINE WAVE DELAYED SWITCHING SIGNAL | DIGITAL ANGLE OUTPUT $\phi$ | COSINE WAVE SWITCHING SIGNAL |
| NON-INVERTED (0) | 270° − hys TO 90° + hys | NON-INVERTED (0) |
| NON-INVERTED (0) | 90° + hys TO 270° − hys | INVERTED (1) |
| INVERTED (1) | 90° − hys TO 270° + hys | INVERTED (1) |
| INVERTED (1) | 270° + hys TO 90° − hys | NON-INVERTED (0) |

SEMICONDUCTOR DEVICE

CROSS-REFERENCE TO RELATED APPLICATIONS

The disclosure of Japanese Patent Application No. 2015-015618 filed on Jan. 29, 2015 including the specification, drawings and abstract is incorporated herein by reference in its entirety.

BACKGROUND

The present invention relates to a semiconductor device, and for example, is used for a resolver to digital converter for converting a signal output from the resolver into a digital signal.

The resolver is known as a rotational angle sensor used in harsh environments, such as for industrial machinery or vehicle power system motors. The resolver outputs an analog sine wave signal indicating the sine of an electrical angle as well as an analog cosine wave signal indicating the cosine of the electrical angle. The resolver to digital converter (hereinafter referred to as R/D converter) converts the sine wave signal and the cosine wave signal into digital values. Then, the resolver calculates the electrical angle based on the sine wave signal and the cosine wave signal that have been digitally converted (see, for example, Japanese Unexamined Patent Application Publication No. 2004-309285 (Patent Document 1)).

SUMMARY

In a typical R/D converter, the sine wave signal and the cosine wave signal are alternately selected by a multiplexer. Then, the selected signal is converted into a digital signal by a common analog to digital (A/D) converter. In this case, the non-linearity error of the A/D converter may cause an error in the finally detected electrical angle. Such an error can occur not only in the R/D converter but also when a plurality of signals are A/D converted sequentially.

These and other objects and advantages will become apparent from the following description of the present specification and the accompanying drawings.

In a semiconductor device according to an embodiment, a switching circuit is provided in front of a multiplexer in order to invert at least one of the sine wave signal and the cosine wave signal.

According to the above described embodiment, it is possible to reduce the angle detection error due to the non-linearity error of the A/D converter.

BRIEF DESCRIPTION OF THE DRAWINGS

FIG. 5 is a view of the relationship between the input and output values in a table format with respect to an angle range determination circuit 13 of FIG. 1;

FIG. 18 is a view of the relationship between the input and output values in a table format with respect to the angle range determination circuit 13 of FIG. 17;

FIGS. 21A and 21B are views showing the relationship between the input and output values in a table format with respect to the respective angle range determination circuits 13A and 13B of FIG. 20.

DETAILED DESCRIPTION

Figure 1:
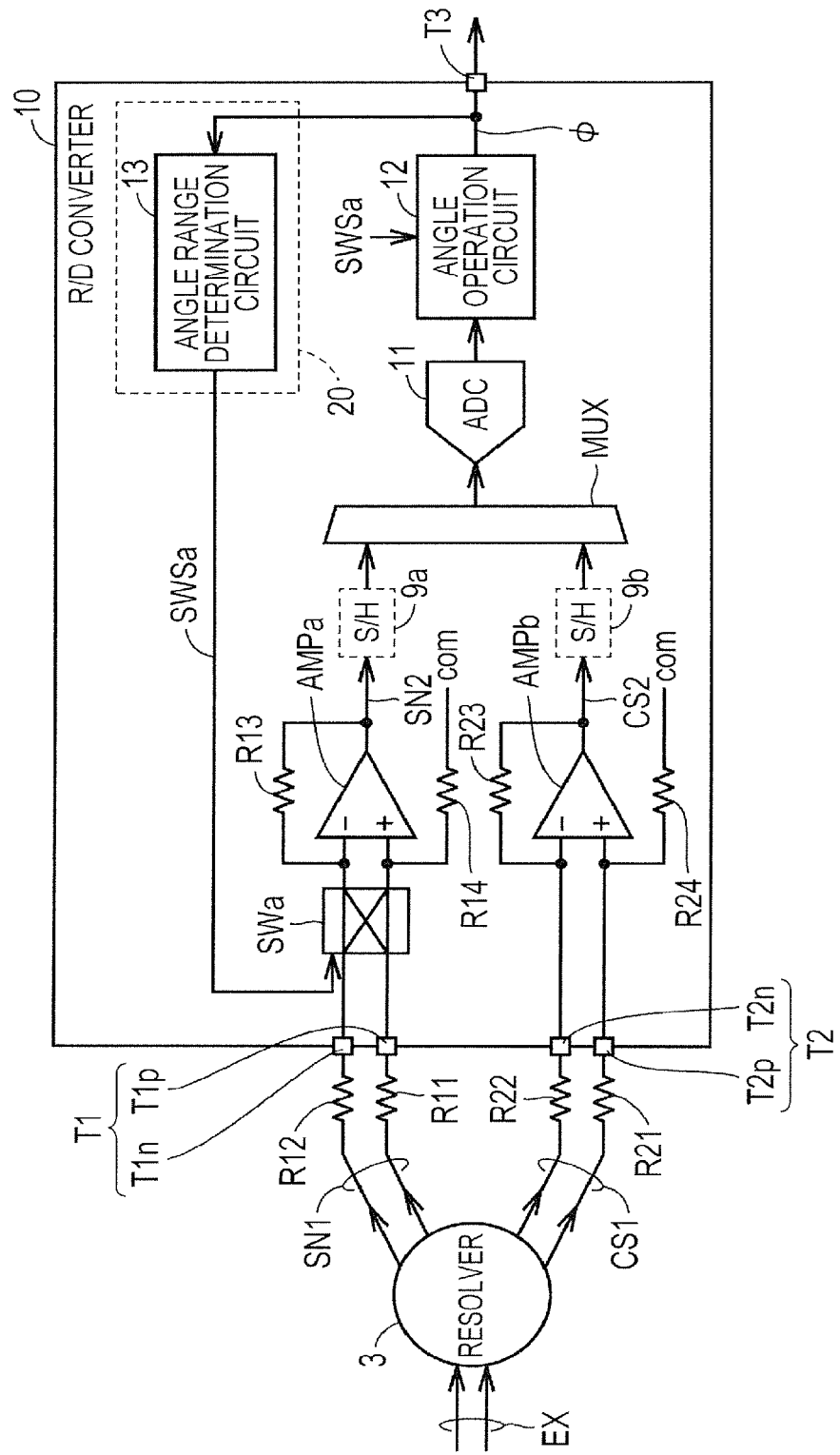
FIG. 1 is a block diagram showing the configuration of an R/D converter 10 as a semiconductor device according to a first embodiment.

Hereinafter, embodiments will be described in detail with reference to the accompanying drawings. It is to be noted that like or corresponding parts are indicated by like reference numerals and the description thereof will not be repeated.

First Embodiment
Configuration of R/D Converter

FIG. 1 is a block diagram showing the configuration of an R/D converter 10 as a semiconductor device according to a first embodiment. Note that in the first embodiment, the R/D converter is described as an example of the semiconductor device. However, as described in a sixth embodiment, it is also possible to configure the semiconductor device by an integrated circuit (for example, a micro controller unit) including R/D converter.

Referring to FIG. 1, the R/D converter 10 includes input parts T1 and T2, an output part T3, amplifiers AMPa and AMPb, resistance elements R13, R14, R23, and R24, a switching circuit SWa, a multiplexer MUX, an A/D converter 11, an angle operation circuit 12, and an angle range determination circuit 13. The R/D converter 10 calculates the angle φ based on the sine wave signal SN1 and on the cosine wave signal CS1 that are received from the resolver 3. The configuration of the respective parts of the resolver 3 and the R/D converter 10 will be described below.

(Resolver)

Figure 2:
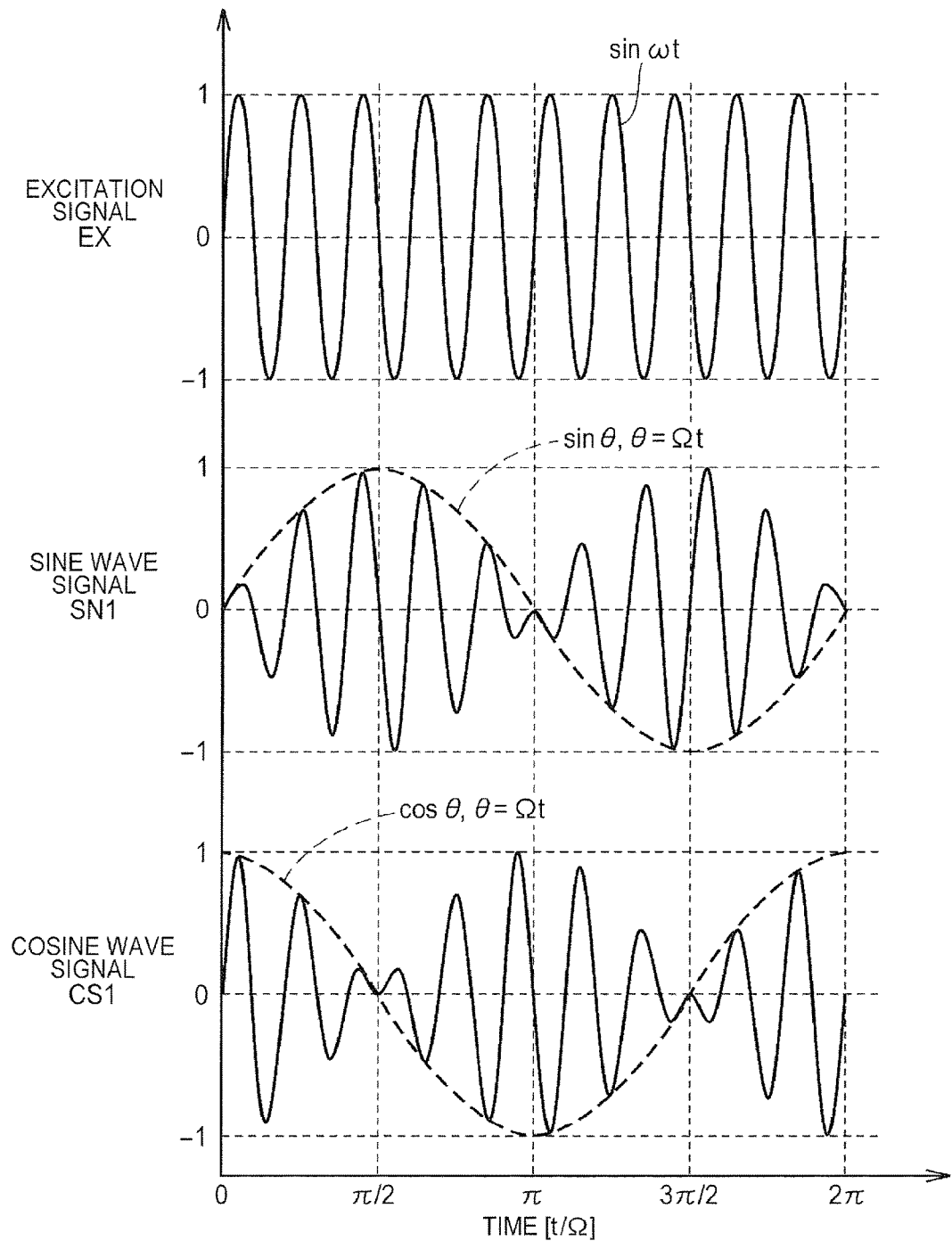
FIG. 2 is a view showing examples of an excitation signal EX input to a resolver 3, as well as a sine wave signal SN1 and a cosine wave signal CS1 that are output from the resolver 3.

The resolver 3 includes one rotor winding and two stator windings. When the axial double angle is 1, the two stator windings are mechanically displaced, for example, by an angle of 90 degrees from each other. When an excitation signal EX is input to the rotor winding, the sine wave signal SN1 obtained by modulating the excitation signal EX by the sine of the electrical angle, as well as the cosine wave signal CS1 obtained by modulating the excitation signal EX by the cosine of the electrical angle are output from the two stator windings, respectively. When the mechanical angle of the rotor is Θ, the electrical angle is θ, and the axial double angle is N, the relationship is given by the equation: $θ=N×Θ$ FIG. 2 is a view showing an example of the excitation signal EX input to the resolver 3 of FIG. 1, as well as the sine wave signal SN1 and the cosine wave signal CS1 that are output from the resolver 3. In FIG. 2, it is assumed that the excitation signal EX is sin (ωt) (where ω is the angle frequency, t is the time) and the rotor rotates at the angle speed Ω (where $ω=10×Ω$). The axial double angle is set to 1. In this case, the rotation angle (electrical angle) θ of the rotor has the relationship of $θ=Ω·t$. Note that the time of the horizontal axis of FIG. 2 is standardized by Ω. In this case, the sine wave signal SN1 is expressed by $sinωt·sinθ=sinωt·sinΩt$, and the cosine wave single CS1 is expressed by $sinωt·cosθ=cosωt·cosΩt$.

Referring FIG. 1 again, positive-side input terminal T1p and negative-side input terminal T1n of the input part T1 are coupled to the resolver 3, respectively, through resistance elements R11 and R12. The input part T1 receives the differential sine wave signal SN1. Positive-side input terminal T2p and negative-side input terminal T2n of the input part T2 are coupled to the resolver 3, respectively, through resistance elements R21 and R22. The input part T2 receives the differential cosine wave signal CS1.

(Amplifier)

The amplifiers AMPa and AMPb are, for example, operation amplifiers. The non-inverting input terminal (positive terminal) of the amplifier AMPa is coupled to the positive side input terminal T1p of the input part T1 through the switching circuit SWa. The inverting input terminal (negative terminal) of the amplifier AMPa is coupled to the negative side input terminal T1n of the input part T1 through the switching circuit SWa. Further, the inverting input terminal (negative terminal) of the amplifier AMPa is also coupled to the output terminal of the amplifier AMPa through the resistance element R13. Then, the non-inverting input terminal (positive terminal) of the amplifier AMPa is coupled to a node that gives a common potential com through the resistance element R14.

Similarly, the non-inverting input terminal (positive terminal) of the amplifier AMPb is coupled to the positive side input terminal T2p of the input part T2, and the inverting input terminal (negative terminal) of the amplifier AMPb is coupled to the negative side input terminal T2n of the input part T2. Further, the inverting input terminal (negative terminal) of the amplifier AMPb is also coupled to the output terminal of the amplifier AMPb through the resistance element R23. Then, the non-inverting input terminal (positive terminal) of the amplifier AMPb is also coupled to a node that gives the common potential com through the resistance element R24.

In the configuration described above, when the resistance elements R11 and R12 are equal in size and when the resistance elements R13 and R14 are equal in size, the amplifier AMPa outputs the signal obtained by subtracting the potential of the negative side input terminal T1n of the input part T1 from the potential of the positive side input terminal T1p of the input part T1. In other words, it outputs the single-end sine wave signal SN2 obtained by amplifying the differential sine wave signal SN1. Similarly, when the resistance elements R21 and R22 are equal in size and when the resistance elements R23 and R24 are equal in size, the amplifier AMPb outputs the signal obtained by subtracting the potential of the negative side input terminal T2n of the input terminal T2 from the potential of the positive side input terminal T2p of the input part T2. In other words, it outputs the single-end cosine wave signal CS2 obtained by amplifying the differential cosine wave signal CS1.

(Switching Circuit)

In the case of the first embodiment, the switching circuit SWa is provided between the input part T1 and the amplifier AMPa. When the switching signal SWSa is in the active state, the switching circuit SWa reverses the plus and minus sides of the sine wave signal SN1 which is a differential signal, namely, inverts the value of the sine wave signal SN1, and inputs to the amplifier AMPa. On the other hand, when the switching signal SWSa is in the inactive state, the switching circuit SWa does not invert the sine wave signal SN1 and inputs the sine wave signal SN1 to the amplifier AMPa. In the following description, the former case is referred to as that the switching circuit SWa is in the inverted state, and the latter case is referred to as that the switching circuit SWa is in the non-inverted state.

In the present embodiment, it is assumed that the logic level of the switching signal SWSa is high level (H level) or "1" when the switching signal SWSa is in the active state. Further, it is assumed that the logic level of the switching signal SWSa is low level (L level) or "0" when the switching signal SWSa is in the inactive state. The above relationship between the active/inactive states and the signal logic levels can be reversed.

Figure 3A:
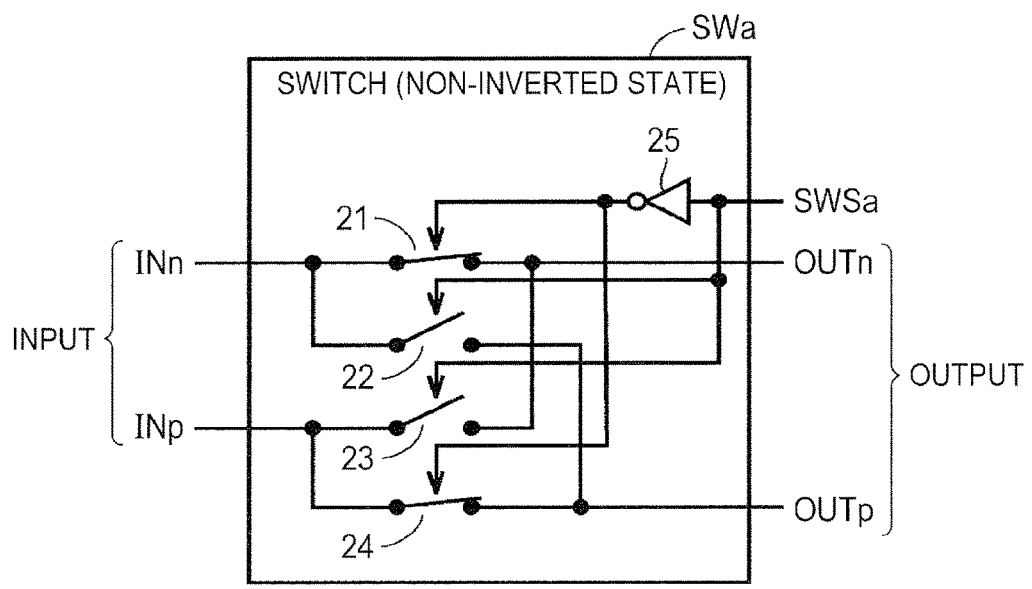
FIGS. 3A and 3B are circuit diagrams showing an example of the configuration and operation of a switching circuit SWa of FIG. 1.
Figure 3B:
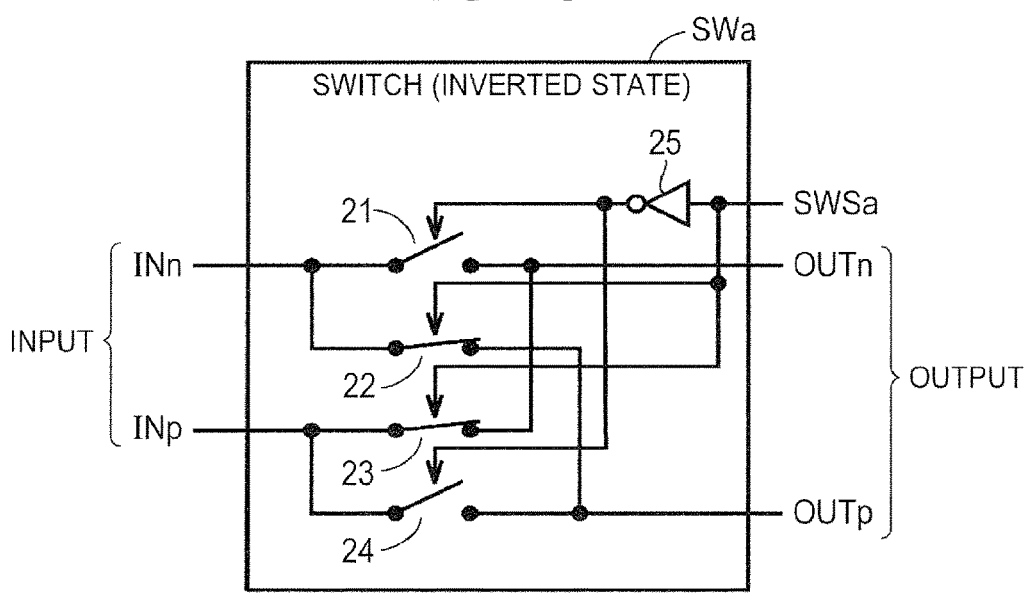

FIGS. 3A and 3B are circuit diagrams showing an example of the configuration and operation of the switching circuit SWa shown in FIG. 1. Referring to FIGS. 3A and 3B, the switching circuit SWa includes switching elements 21 to 24 and an inverter 25. The switching element 21 is coupled between an input node INn and an output node OUTn. The switching element 22 is coupled between the input node INn and an output node OUTp. The switching element 23 is coupled between an input node INp and the output node OUTn. The switching element 24 is coupled between the input node INp and the output node OUTp.

Each of the switching elements 21 to 24 is configured, for example, with a P-type meta oxide semiconductor (MOS) transistor. The switch element is conductive when the control electrode receives an active control signal. On the other hand, the switching element is non-conductive when the control electrode receives an inactive control signal. A signal obtained by inverting the logic level of the switching signal SWSa by the inverter 25, is input as the control signal to the switching elements 21 and 24. The switching signal SWSa is input as the control signal to the switching elements 22 and 23.

Thus, as shown in FIG. 3A, when the switching signal SWSa is in the inactive state (L level or "0"), the switching circuit SWa changes to the non-inverted state. As shown in FIG. 3B, when the switching signal SWSa is in the active state (H level or "1"), the switching circuit SWa changes to the inverted state.

(Multiplexer, A/D Converter)

Referring to FIG. 1 again, the multiplexer MUX alternately selects the sine wave signal SN2 output from the amplifier AMPa and the cosine wave signal CS2 output from the amplifier AMPb. Then, the multiplexer MUX outputs the selected signal to the A/D converter 11. The switching time when the multiplexer MUX alternately switches the signals (each of the periods for selecting the amplifier AMPa one time and for selecting the amplifier AMPb one time) is set to the time required for converting the analog value sampled by the A/D converter 11 into the value of one angle φ, which is, for example, about one hundredth the cycle (2π/ω) of the excitation signal EX. Note that sample & hold (S/H) circuits 9a, 9b may be provided between the multiplexer MUX and the respective amplifiers AMPa and AMPb.

The A/D converter (ADC: Analog to Digital Converter) 11 converts the sine wave signal SN2 and the cosine wave signal CS2, which are selected by the multiplexer MUX, into digital values. For example, a sequential transformation method, or the like, can be used as the A/D converter 11.

(Angle Operation Circuit)

The angle operation circuit 12 calculates the angle φ corresponding to the electrical angle θ of the rotor based on the sine wave signal SN2 and the cosine wave signal CS2 that are converted into digital values by the A/D converter 11 (in which φ=θ when the error is 0).

Figure 4:
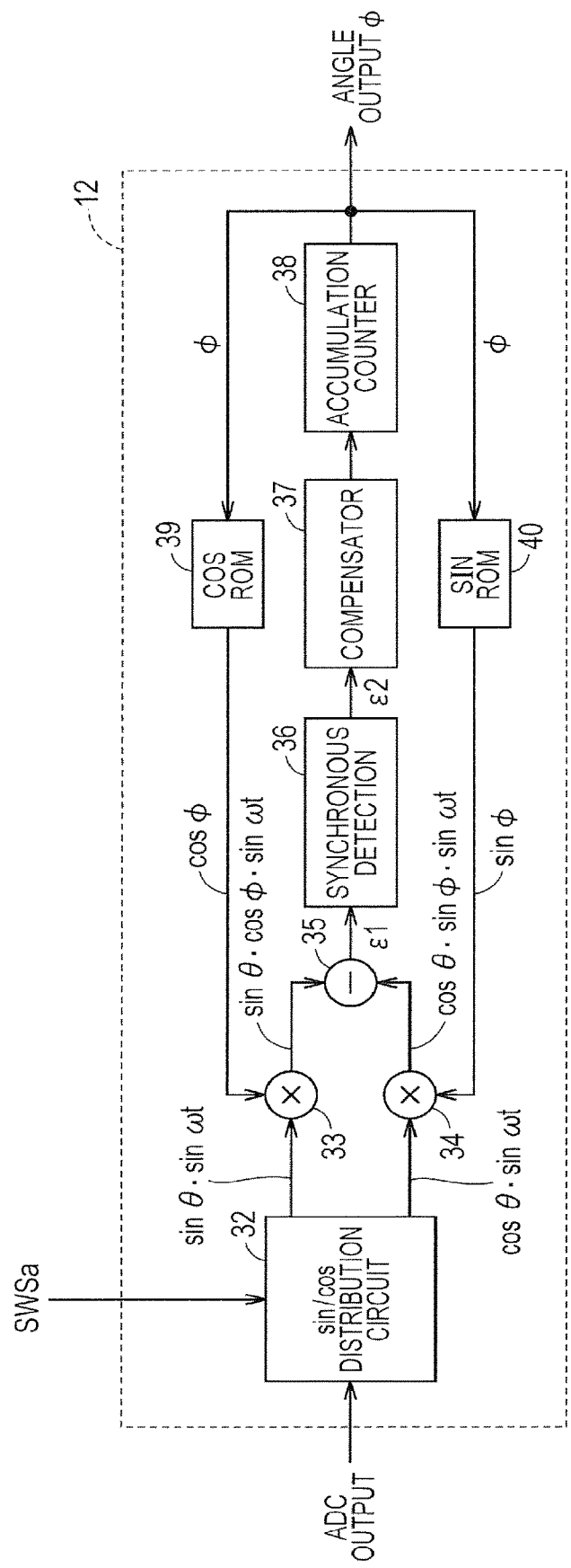
FIG. 4 is a block diagram showing an example of the configuration of an angle operation circuit 12 of FIG. 1.

FIG. 4 is a block diagram showing an example of the configuration of the angle operation circuit 12 shown in FIG. 1. Referring to FIG. 4, the angle operation circuit 12 has a known configuration, including a sin/cos distribution circuit 32, multiplication circuits 33 and 34, a subtraction circuit 35, a synchronous detection circuit 36, a compensator 37, an accumulation counter 38, a cosine read only memory (ROM) 39, and a sine ROM 40. In the following description, it is assumed that the excitation signal EX is sin (ωt) and the electrical angle of the rotor is θ.

The sin/cos distribution circuit 32 distributes the output of the A/D converter 11 into the sine wave signal SN2 (sinθ·sinωt) and the cosine wave signal CS2 (cosθ·sinωt). At this time, when the sine wave signal SN2 is inverted based on the switching signal SWSa, it is multiplied by minus one and returned to the original value.

The multiplication circuit 33 multiplies the sine wave signal SN2 (sinθ·sinωt) and the cosine (cosφ) of the calculated angle φ. The multiplication circuit 34 multiplies the cosine wave signal CS2 (cosθ·sinωt) and the sine (sinφ) of the calculated angle φ. Note that the cosine ROM 39 outputs the cosine (cosφ) of the current angle φ, based on the relationship between the various angles φ stored in advance and the cosine (cosφ) of the respective angles. The sine ROM 40 outputs the sine (sinφ) of the current angle φ, based on the relationship between the various angles φ stored in advance and the sine (sinφ) of the respective angles.

The subtraction circuit 35 calculates the deviation ε1 by subtracting the output of the multiplication circuit 34 from the output of the multiplication circuit 33. The deviation ε1 is given by the following equation:

$$\varepsilon 1 = \sin\theta \cdot \cos\phi \cdot \sin\omega t - \cos\theta \cdot \sin\phi \cdot \sin\omega t \quad (1)$$
$$= \sin(\theta - \phi) \cdot \sin\omega t$$

The synchronous detection circuit 36 calculates the deviation ε2=sin(θ−φ) by removing the excitation signal component (sinωt) from the deviation ε1 output from the subtraction circuit 35. The output of the synchronous detection circuit 36 is counted by the accumulation counter 38 through the compensator 37. As a result, the angle φ is calculated. By controlling the deviation ε2 to be 0, θ=φ is given.

(Angle Range Determination Circuit)

Referring to FIG. 1 again, the angle range determination circuit 13 is a logic circuit for generating the switching signal SWSa based on the calculated angle φ. In response to the generated switching signal SWSa, the switching circuit SWa is switched so that the sine wave signal SN2 and the cosine wave signal CS2, which are input to the A/D converter 11, have the same phase. Note that the angle range determination circuit 13 configures a switch control circuit 20 that controls the switching timing of the switching circuit SWa. Further details will be described below with reference to FIGS. 1 and 5.

FIG. 5 is a view showing the relationship between the input and output values in a table format with respect to the angle range determination circuit 13 of FIG. 1.

Referring to FIG. 5, when the angle φ (=θ) is in the first quadrant (0 to 90 degrees), sinθ≥0 and cosθ≥0. Further, when the angle φ (=θ) is in the third quadrant (180 to 270 degrees), sinθ≤0 and cosθ≤0. For this reason, the input sine wave signal SN1 (sinθ·sinωt) and the input cosine wave signal CS1 (cosθ·sinωt) are originally the same in the phase in these angle ranges. Thus, the switching signal SWSa changes to the inactive state ("0"), and the switching circuit SWa is controlled to be brought into the non-inverted state.

On the other hand, when the angle φ (=θ) is in the second quadrant (90 to 180 degrees), sinθ≥0 and cosθ≤0. Further, when the angle φ (=θ) is in the fourth quadrant (270 to 360 degrees), sinθ≤0 and cosθ≥0. For this reason, the input sine wave signal SN1 (sinθ·sinωt) and the input cosine wave signal CS1 (cosθ·sinωt) are reversed in phase in these angle ranges. Thus, the switching signal SWSa changes to the active state ("1"), and the switching circuit SWa is controlled to be brought into the inverted state.

Note that when the angle φ is expressed by a digital value of a binary code, the highest and next highest bit values of "00" show that the angle φ is in the first quadrant, the bit values "01" show that the angle φ is in the second quadrant, the bit values "10" show that the angle φ is in the third quadrant, and the bit values "11" show that the angle φ is in the fourth quadrant. Thus, when the second highest bit value is "1", the angle φ represents the angle of the second and fourth quadrants. Then, when the second highest bit value is "0", the angle φ represents the angle of the first and third quadrants. In this case, the angle range determination circuit 13 is configured with a circuit that refers to the second highest bit value and outputs the bit value as the switching signal SWSa.

Characteristics of the Operation of the R/D Converter

Hereinafter, the characteristics of the operation of the R/D converter 10 will be described. As described above, the R/D converter 10 of FIG. 1 calculates the angle φ based on the input sine wave signal SN1 and on the input cosine wave signal CS1. The angle range determination circuit 13 is provided in the R/D converter 10 to switch the switching signal SWSa between active and inactive according to the range of the calculated angle φ. When the switching signal SWSa is in the active state, the switching circuit SWa changes to the inverted state, so that the sine wave signal SN1 is inverted (in such a way that the signal on the positive side and the signal on the negative side are reversed). More specifically, when the angle φ is in the second quadrant (90 to 180 degrees) or the fourth quadrant (270 to 360 degrees), the switching circuit SWa is controlled to be brought into the inverted state. A specific example is described below.

Figure 6A:
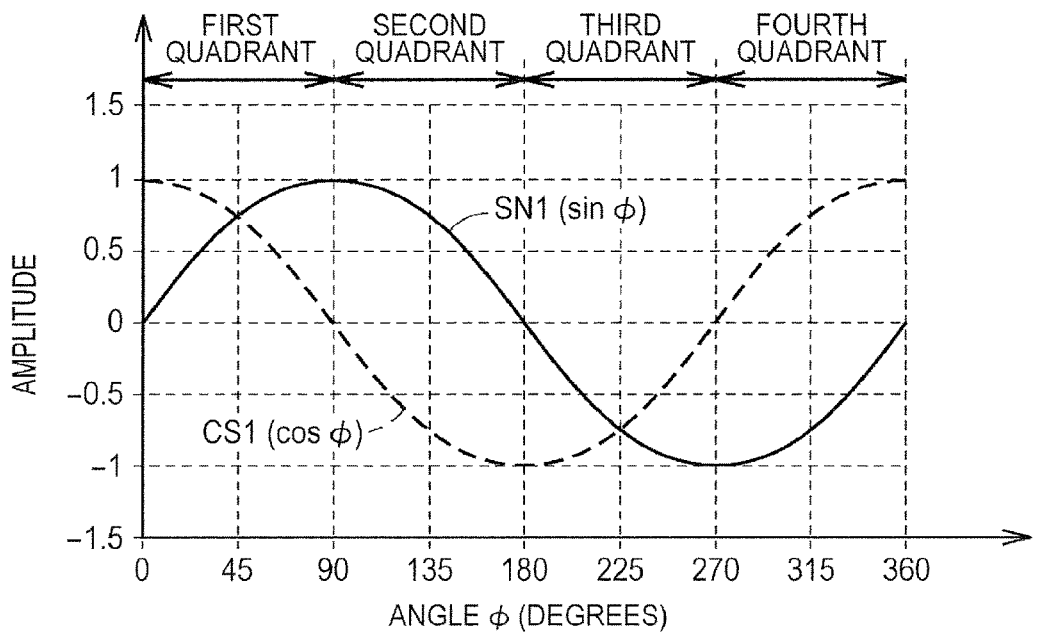
FIGS. 6A and 6B are graphs showing the relationship between the amplitude and the angle φ with respect to a sine wave signal SN1 and a cosine wave signal CS1.
Figure 6B:
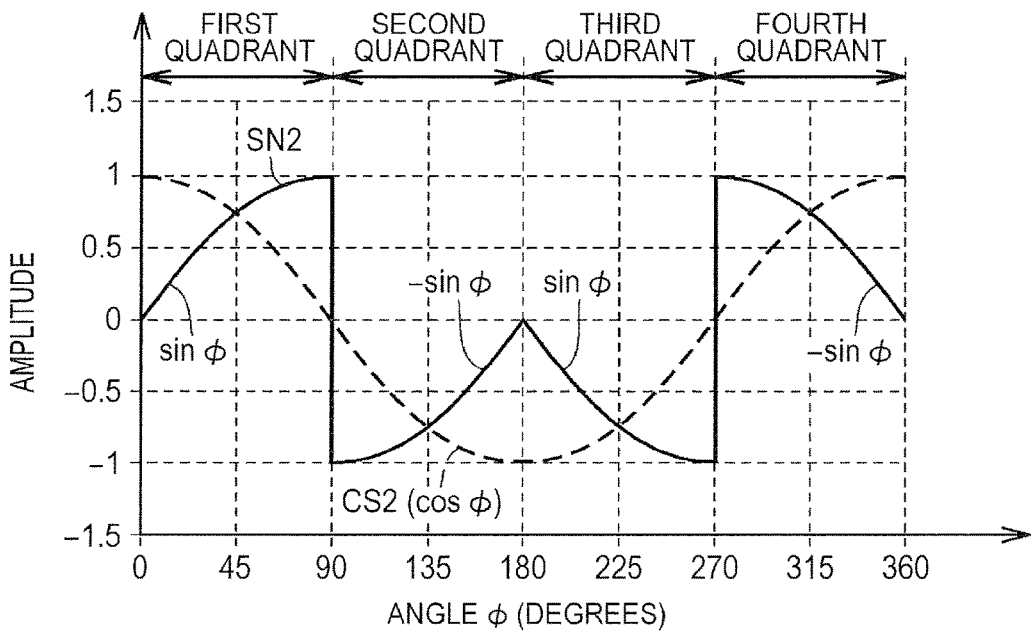

FIGS. 6A and 6B are graphs showing the relationship between the amplitude and the angle φ with respect to the sine wave signal and the cosine wave signal. In FIGS. 6A and 6B, it is shown the amplitude at the time (ω·t=π/2, 5π/2, and so on) when the excitation signal EX (sinωt) is 1. FIG. 6A shows the relationship between the amplitude and the angle φ of the sine wave signal SN1 (sinφ) and the cosine wave signal CS1 (cosφ) that are input to the R/D converter 10. FIG. 6B shows the relationship between the amplitude and the angle φ of the sine wave signal SN2 (sinφ or −sinφ) and the cosine wave signal CS2 (cosφ) that are input to the A/D converter 11.

As shown in FIG. 6B, when the angle φ is in the second or fourth quadrant, the sine wave signal SN2 input to the A/D converter 11 is switched to the signal (−sinφ) obtained by inverting the original sine wave signal SN1 (sinφ) by the switching circuit SWa. As a result, the values of the sine wave signal SN2 and the cosine wave signal CS2, which are input to the A/D converter 11, can be closer to each other than the previous values before input to the R/D converter 10.

Figure 7:
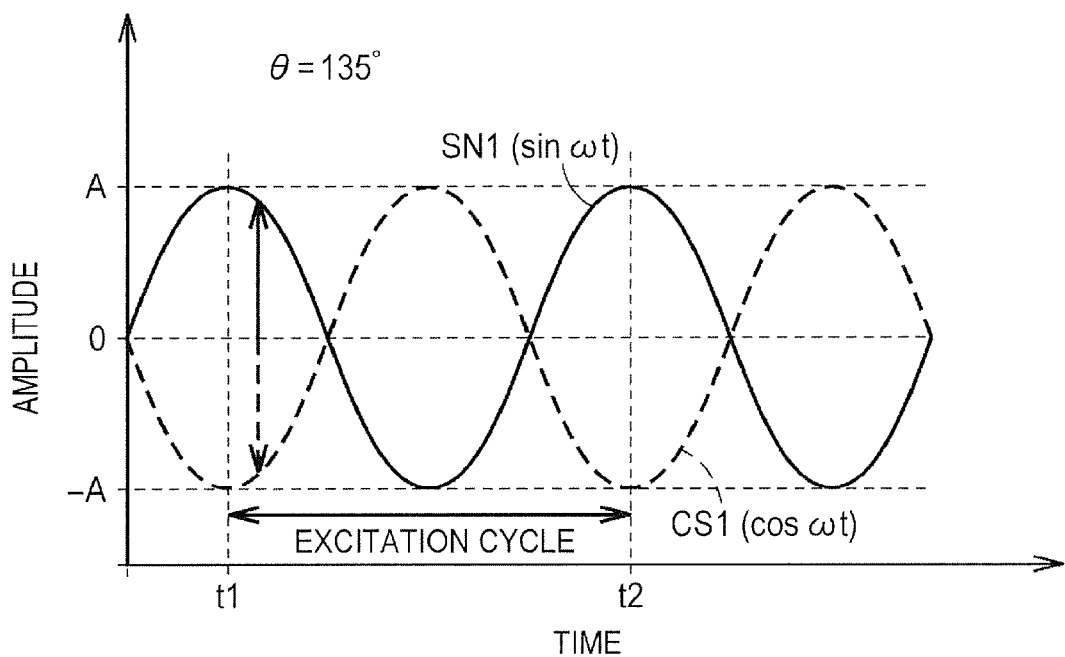
FIG. 7 is a waveform diagram of the sine wave signal SN1 and the cosine wave signal CS1 when the electrical angle θ is 135 degrees.

FIG. 7 shows the waveforms of the sine wave signal SN1 and the cosine wave signal CS1 when the electrical angle θ is 135 degrees. In FIG. 7, it is assumed that A=sin (135 degrees)=−cos(135 degrees).

As shown in FIG. 7, when θ=135 degrees, the sine wave signal SN1 (A·sinωt) and the cosine wave signal CS1 (−A·sinωt), which are input to the R/D converter 10, are the same in amplitude but reversed in phase to each other. In this case, the sine wave signal SN1 is inverted in the switching circuit SWa, so that the sine wave signal SN2 (−A·sinωt) and the cosine wave signal CS2 (−A·sinωt), which are input to the A/D converter 11, are exactly the same. Thus, the calculated angle φ is exactly equal to 135 degrees.

Even if the switching circuit SWa of FIG. 1 is not provided, there is no error in the calculated angle φ as long as there is no non-linearity error in the A/D converter 11. However, the actual A/D converter 11 ever has a non-linearity error, which results in an error in the angle φ.

Figure 8:
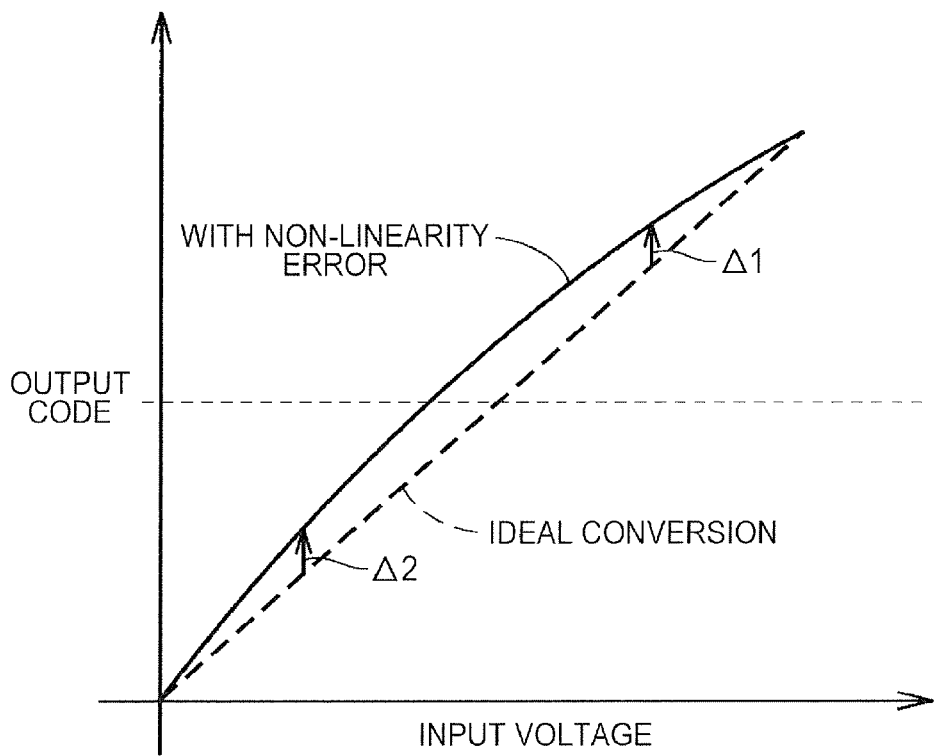
FIG. 8 is a view for illustrating the non-linearity error of an A/D converter.

FIG. 8 is a view for illustrating the non-linearity error of the A/D converter. Also in FIG. 8, it is assumed that the electrical angle θ (=φ) is 135 degrees.

Referring to FIGS. 1 and 8, when the switching circuit SWa of FIG. 1 is not provided, the sine wave signal SN1 (A·sinωt) and the cosine wave signal CS1 (−A·sinωt), which are input to the R/D converter 10, remain unchanged and are input to the A/D converter 11. In this case, the sine wave signal output from the A/D converter 11 is A·sinωt+Δ1, and the cosine wave signal output from the A/D converter 11 is −A·sinωt+Δ2. Because Δ1 is not equal to −Δ2, the angle φ output from the angle operation circuit 12 is not 135 degrees and an angle error occurs.

On the other hand, according to the R/D converter 10 of the first embodiment, when the electrical angle θ is 135 and 315 degrees, the sine wave signal is inverted. Thus, the sine wave signal and the cosine wave signal are the same in value when they are obtained by the A/D converter 10. As a result, when the sine wave signal is returned to the original value by multiplying the sine wave signal by minus one by the angle calculation circuit 12, the sine wave signal is correctly equal to the cosine wave signal multiplied with minus one. This eliminates the angle conversion error due to the non-linearity error of the A/D converter 11.

Effect

As described above, according to the R/D converter 10 of the first embodiment, when the range of the calculated angle φ is the second quadrant (90 to 180 degrees) and the fourth quadrant (270 to 360 degrees), the switching circuit SWa is provided to invert the sine wave signal. In this way, the sine wave signal and the cosine wave signal, which are input to the A/D converter 11, are typically the same in phase and their values are close to each other, so that they are not likely to be affected by the nonlinearity error of the A/D converter 11.

Variation

It is also possible to provide the switching circuit SWb between the input part T2 and the amplifier AMPb, instead of between the input part T1 and the amplifier AMPa, to allow the cosine wave signal CS1, instead of the sine wave signal SN1, to be inverted. In this case, the switching circuit SWb inverts the cosine wave signal CS1 when the range of the angle φ is the second quadrant (90 to 180 degrees) and the fourth quadrant (270 to 360 degrees).

Second Embodiment

Configuration

Figure 9:
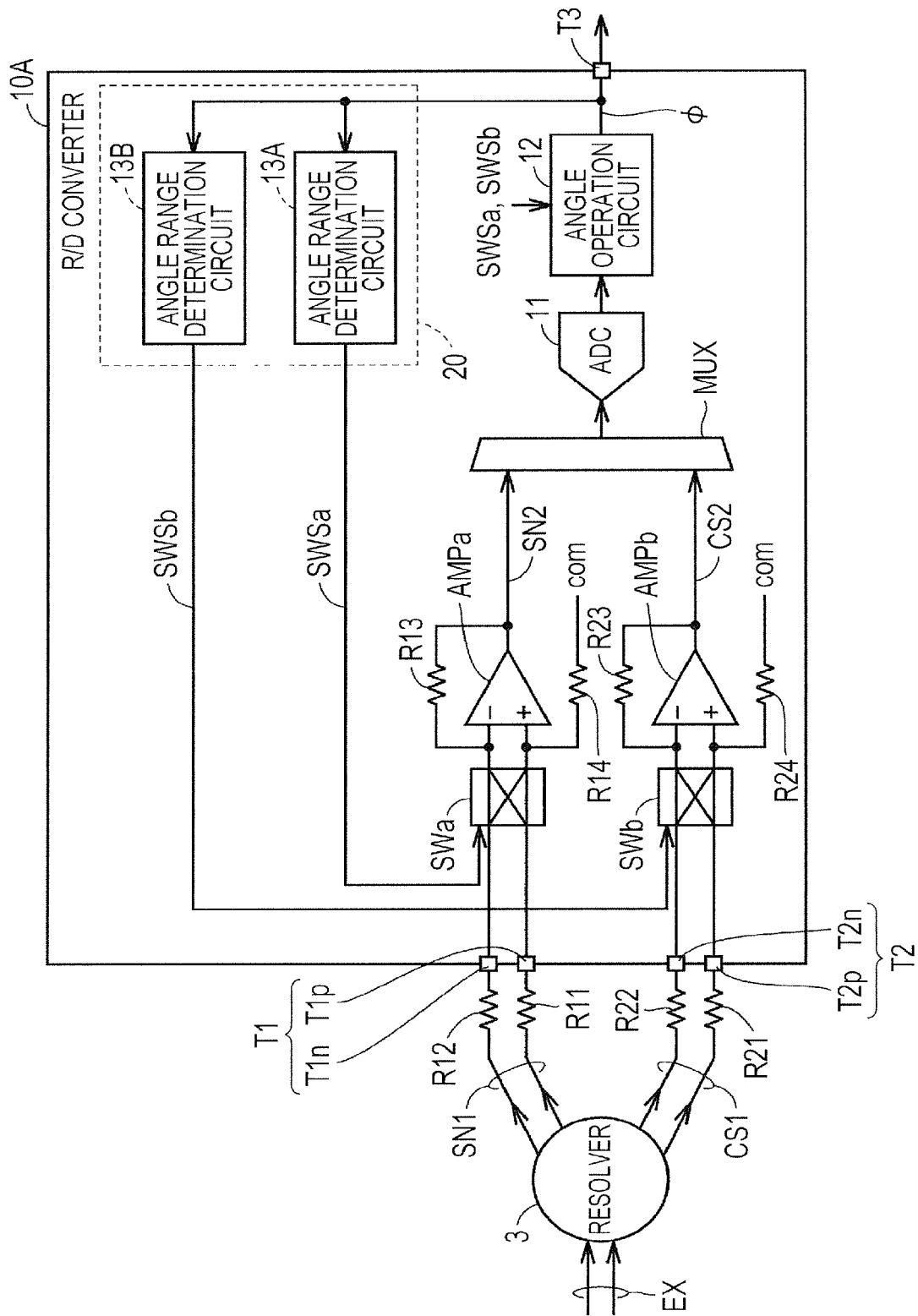
FIG. 9 is a block diagram showing the configuration of an R/D converter 10A according to a second embodiment.

FIG. 9 is a block diagram showing the configuration of an R/D converter 10A according to a second embodiment.

Referring to FIG. 9, the R/D converter 10A of the second embodiment is different from the R/D converter 10 of FIG. 1 in that the switching circuit SWb is further provided between the input part T2 and the amplifier AMPb. In the case of FIG. 9, there are provided the angle range determination circuit 13A for controlling the switching circuit SWa based on the calculated angle φ, as well as the angle range determination circuit 13B for controlling the switching circuit SWb based on the angle φ. Since the example of the configuration of the switching circuits SWa, SWb is the same as that described in FIGS. 3A and 3B, the description thereof will not be repeated. Note that the angle range determination circuits 13A and 13B configure the switch control circuit 20 that controls the switching timing of the switching circuits SWa and SWb.

Figures 10, 11:
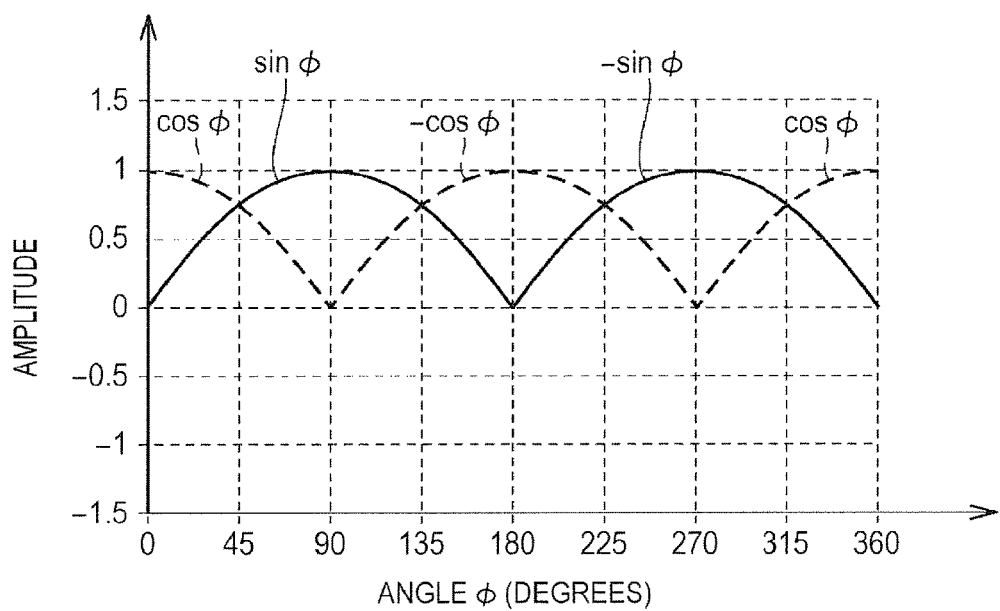
FIG. 10 is a view of the relationship between the input and output values in a table format with respect to respective angle range determination circuits 13A and 13B of FIG. 9.
FIG. 11 is a graph of the relationship between the amplitude and the angle φ with respect to a sine wave signal SN2 and a cosine wave signal CS2 that are input to an A/D converter 11, in the R/D converter 10A of FIG. 9.

FIG. 10 is a view of the relationship between the input and output values in a table format with respect to the angle range determination circuits 13A and 13B of FIG. 9. In the angle range determination circuits 13A and 13B of FIG. 9, the sine wave signal SN2 or the cosine wave signal CS2 is inverted according to the angle φ so that both the sine wave signal SN2 and the cosine wave signal CS2, which are input to the A/D converter 11, are greater than the common potential com.

More specifically, as shown in FIG. 10, when the range of the angle φ is the third and fourth quadrants (180 to 360 degrees), the angle range determination circuit 13A for the sine wave activates ("1") the switching signal SWSa to bring the switching circuit SWa for the sine wave signal SN1 into the inverted state. When the range of the angle φ is the first and second quadrants (0 to 180 degrees), the angle range determination circuit 13A inactivates ("0") the switching signal SWSa to bring the switching circuit SWa for the sine wave signal SN1 into the non-inverted state.

Meanwhile, when the range of the angle φ is the second and third quadrants (90 to 270 degrees), the angle range determination circuit 13B for the cosine wave activates ("1") the switching signal SWSb to bring the switching circuit SWb for the cosine wave signal CS2 into the inverted state. When the range of the angle ϕ is the first quadrant (0 to 90 degrees) and the fourth quadrant (270 to 360 degrees), the angle range determination circuit 13B inactivates ("0") the switching signal SWSb to bring the switching circuit SWb for the cosine wave signal CS1 into the non-inverted state.

In the above case, when the angle ϕ is expressed by a digital value of a binary code, the highest and next highest bit values of "00" indicate that the angle ϕ is in the first quadrant, the bit values of "01" indicate that the angle ϕ is in the second quadrant, the bit values "10" indicate that the angle ϕ is in the third quadrant, and the bit values "11" indicate that the angle ϕ is in the fourth quadrant. In this case, the angle range determination circuit 13A is configured with a circuit that refers to the highest bit and outputs the value as the switching signal SWSa. The angle range determination circuit 13B is configured with a logic circuit that refers to the highest bit value and the next highest bit value, calculates the XOR sum of the two values, and outputs the result as the switching signal SWSb.

Note that when the sine wave signal SN1 and the cosine wave signal CS1 are inverted based on the switching signals SWSa and SWSb, the angle operation circuit 12 multiplies the sine wave signal SN1 and the cosine wave signal CS1 by minus one to return to their original values before inversion. The other configurations in FIG. 9 are the same as those in FIG. 1, so that like or corresponding parts are indicated by like reference numerals as used in FIG. 1 and the description thereof will not be repeated.

Effect

FIG. 11 is a graph of the relationship between the amplitude and the angle ϕ of the sine wave signal SN2 and the cosine wave signal CS2 that are input to the A/D convert 11 in the R/D converter 10A of FIG. 9. In FIG. 11, it is shown the amplitude of the time (ω·t=π/2, 5π/2, and so on) when the excitation signal EX (sinωt) is 1.

In the first embodiment, it is found from the corresponding graph of FIG. 6B that the potential of the sine wave signal SN2 greatly varies at 90 and 270 degrees, which are the angles ϕ at which the switching circuit SWa is switched. Because of this noise occurs, which is a factor of the angle error. On the other hand, in the graph of FIG. 11, the amplitude of the sine wave signal SN1 or cosine wave signal CS1 to be inverted is 0 at 90, 180, and 270 degrees, which are the angles ϕ at which the switching circuit SWa or SWb is switched. This reduces the occurrence of noise, and thus it is possible to reduce the angle error compared to the case of the first embodiment.

Variation

Figures 12, 13:
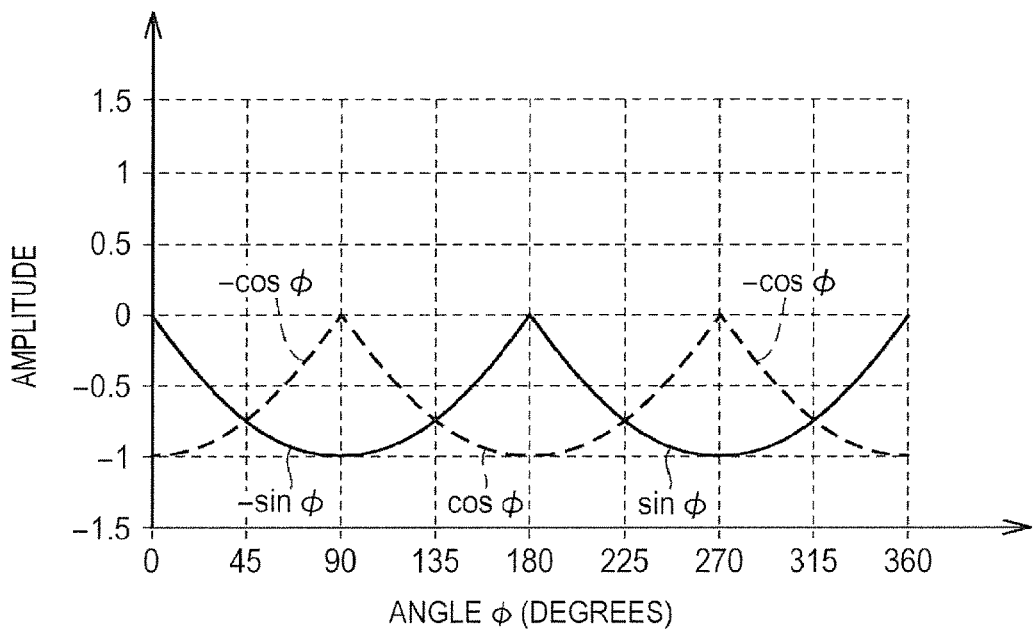
FIG. 12 shows the relationship between the input and output values in a table format, in a variation of the angle range determination circuits 13A and 13B of FIG. 9.
FIG. 13 is a graph of the relationship between the amplitude and the angle φ with respect to the sine wave signal SN2 and the cosine wave signal CS2 that are input to the A/D converter 11, in a variation of the second embodiment.

FIG. 12 is a view of the relationship between the input and output values in a table format, in the variation of the respective angle range determination circuits 13A and 13B shown in FIG. 9. In the variation of the angle range determination circuits 13A and 13B shown in FIG. 12, the sine wave signal SN2 or the cosine wave signal CS2 is inverted according to the angle ϕ, so that both the sine wave signal SN2 and the cosine wave signal CS2, which are input to the A/D converter 11, are smaller than the common potential com.

More specifically, as shown in FIG. 12, when the range of the angle ϕ is the first and second quadrants (0 to 180 degrees), the angle range determination circuit 13A for the sine wave activates ("1") the switching signal SWSa to bring the switching circuit SWa for the sine wave signal SN1 into the inverted state. When the range of the angle ϕ is the third and fourth quadrants (180 to 360 degrees), the angle range determination circuit 13A inactivates ("0") the switching signal SWSa to bring the switching circuit SWa for the sine wave signal SN1 into the non-inverted state.

Meanwhile, when the range of the angle ϕ is the first quadrant (0 to 90 degrees) and the fourth quadrant (270 to 360 degrees), the angle range determination circuit 13B for the cosine wave activates ("1") the switching signal SWSb to bring the switching circuit SWb for the cosine wave signal CS1 into the inverted state. When the range of the angle ϕ is the second and third quadrants (90 to 270 degrees), the angle range determination circuit 13B inactivates ("0") the switching signal SWSb to bring the switching circuit SWb for the cosine wave signal CS2 into the non-inverted state.

In the above variation, when the angle ϕ is expressed by a digital value of a binary code, the angle range determination circuit 13A is configured with a logic circuit for referring to the highest bit, generating an inverted signal of the bit value, and outputting the inverted signal as the switching signal SWSa. The angle range determination circuit 13B is configured with a logic circuit for referring to the highest bit value and the next highest bit value, generating an inverted signal of the XOR sum of the two values, and outputting the inverted signal as the switching signal SWSb.

FIG. 13 is a graph of the relationship between the amplitude and the angle ϕ of the sine wave signal SN2 and the cosine wave signal CS2 that are input to the A/D converter 11, in the variation of the second embodiment. In FIG. 13, it is shown the amplitude at the time (ω·t=π/2, 5π/2, and so on) when the excitation signal EX (sinωt) is 1.

Similarly to the case of FIG. 11, the amplitude of the sine wave signal SN1 or cosine wave signal CS1 to be inverted is 0 at 90, 180, and 270 degrees, which are the angles ϕ at which the switching circuit SWa or SWb is switched. This reduces the occurrence of noise, and thus it is possible to reduce the angle error compared to the case of the first embodiment.

Third Embodiment

Configuration and Operation

Figure 14:
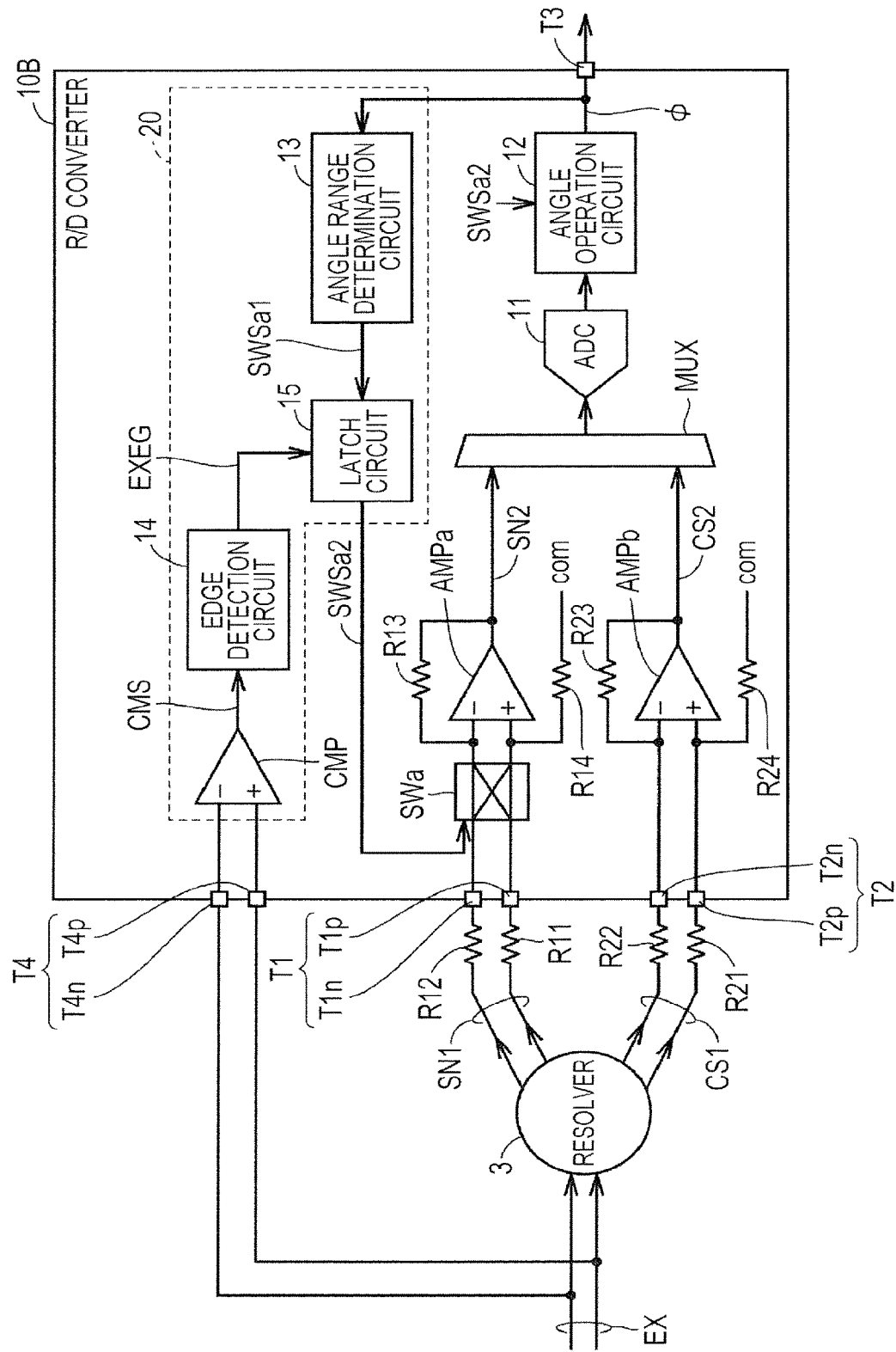
FIG. 14 is a block diagram showing the configuration of an R/D converter 10B according to a third embodiment.

FIG. 14 is a block diagram showing the configuration of an R/D converter 10B according to a third embodiment. The R/D converter 10B of FIG. 14 is different from the R/D converter of FIG. 1 in that a comparator CMP, an edge detection circuit 14, and a latch circuit 15 are further included.

The comparator CMP compares the positive side signal and negative side signal of the differential excitation signal EX. When the value of the excitation signal EX is positive, the comparator CMP outputs the comparison signal CMS of high level (H level). While when the excitation signal EX is negative, the comparator CMP outputs the comparison signal CMS of low level (L level).

The edge detection circuit 14 detects the rising edge and falling edge of the comparison signal CMS output from the comparator CMP. The edge detection circuit 14 outputs a one-shot pulse (excitation edge signal EXEG) at the timing of the rising edge and falling edge of the comparison signal CMS. Thus, the zero crossing point at which the value of the excitation signal EX crosses 0 (the common potential com) is detected by the comparator CMP and the edge detection circuit 14.

The latch circuit 15 holds a switching signal SWSa1 output from the angle range determination circuit 13, and outputs the switching signal SWSa1 in synchronization with the timing of the excitation edge signal EXEG output from the edge detection circuit 14. The switching circuit SWa switches between the inverted state and the non-inverted state in response to the switching signal SWSa2 output from the latch circuit 15. Thus, the timing of switching between the inverted state and the non-inverted state in the switching circuit SWa is synchronized with the timing of the zero crossing point of the excitation signal EX.

Note that when the sine wave signal SN2 is inverted based on the switching signal SWSa2, the angle operation circuit 12 multiplies the value of the sine wave signal SN2 by minus one to return to the original value. Since the other points in FIG. 14 are the same as those in FIG. 1, like or corresponding parts are indicated by like reference numerals as used in FIG. 1 and the description thereof will not be repeated.

In the above configuration, the angle range determination circuit 13, the comparator CMP, the edge detection circuit 14, and the latch circuit 15 configure the switch control circuit 20 that controls the timing of the switching of the switching circuit SWa.

Figure 15:
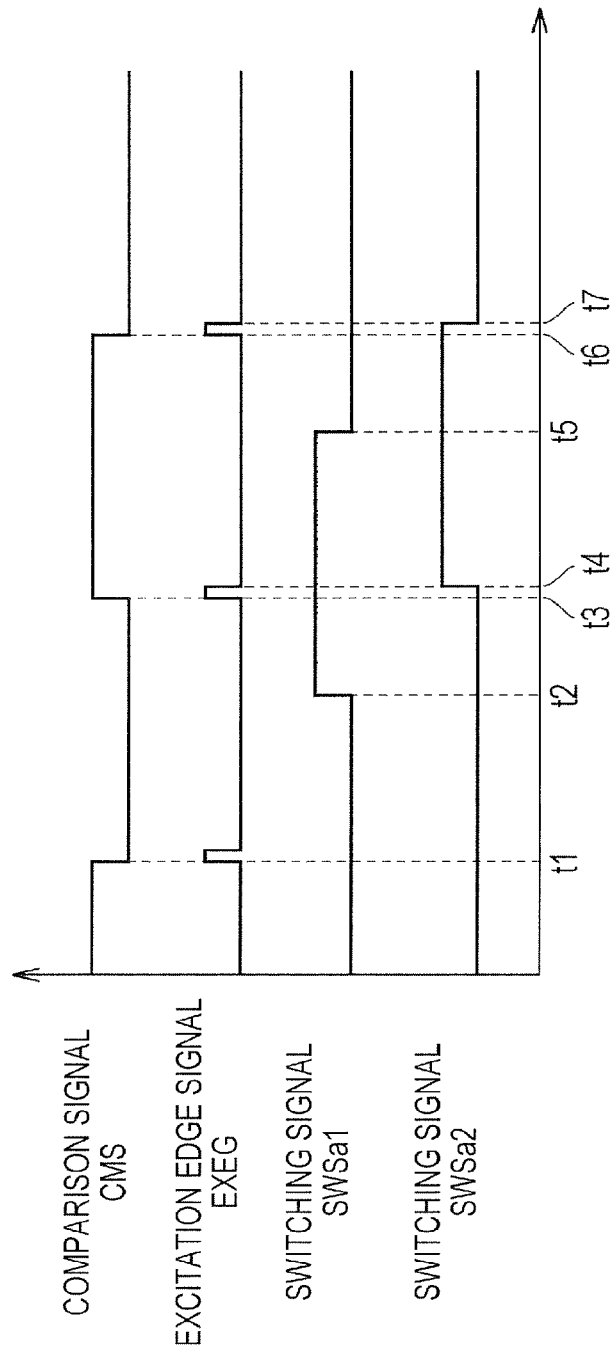
FIG. 15 is a timing diagram showing the operation waveforms of the respective parts shown in FIG. 14.

FIG. 15 is a timing diagram showing the operation waveforms of the respective parts shown in FIG. 14. In FIG. 15, the comparison signal CMS, the excitation edge signal EXEG, and the switching signals SWSa1 and SWSa2 in FIG. 14 are shown beginning at the top.

Referring to FIGS. 14 and 15, the edge of the comparison signal CMS is detected at times t1, t3, and t6 in FIG. 15. Then, the one-shot pulse is output as the excitation edge signal EXEG.

The switching signal SWSa1 is switched from L level to H level at time t2. In this case, the timing of the rise of the switching signal SWSa2 output from the latch circuit 15 is delayed until time t4 when the excitation edge signal EXEG is activated (switched to H level).

The switching signal SWSa1 is switched from H level to L level at time t5. In this case, the timing of the fall of the switching signal SWSa2 output from the latch circuit 15 is delayed until time t7 when the excitation edge signal EXEG is activated (switched to H level).

Effect

Figure 16:
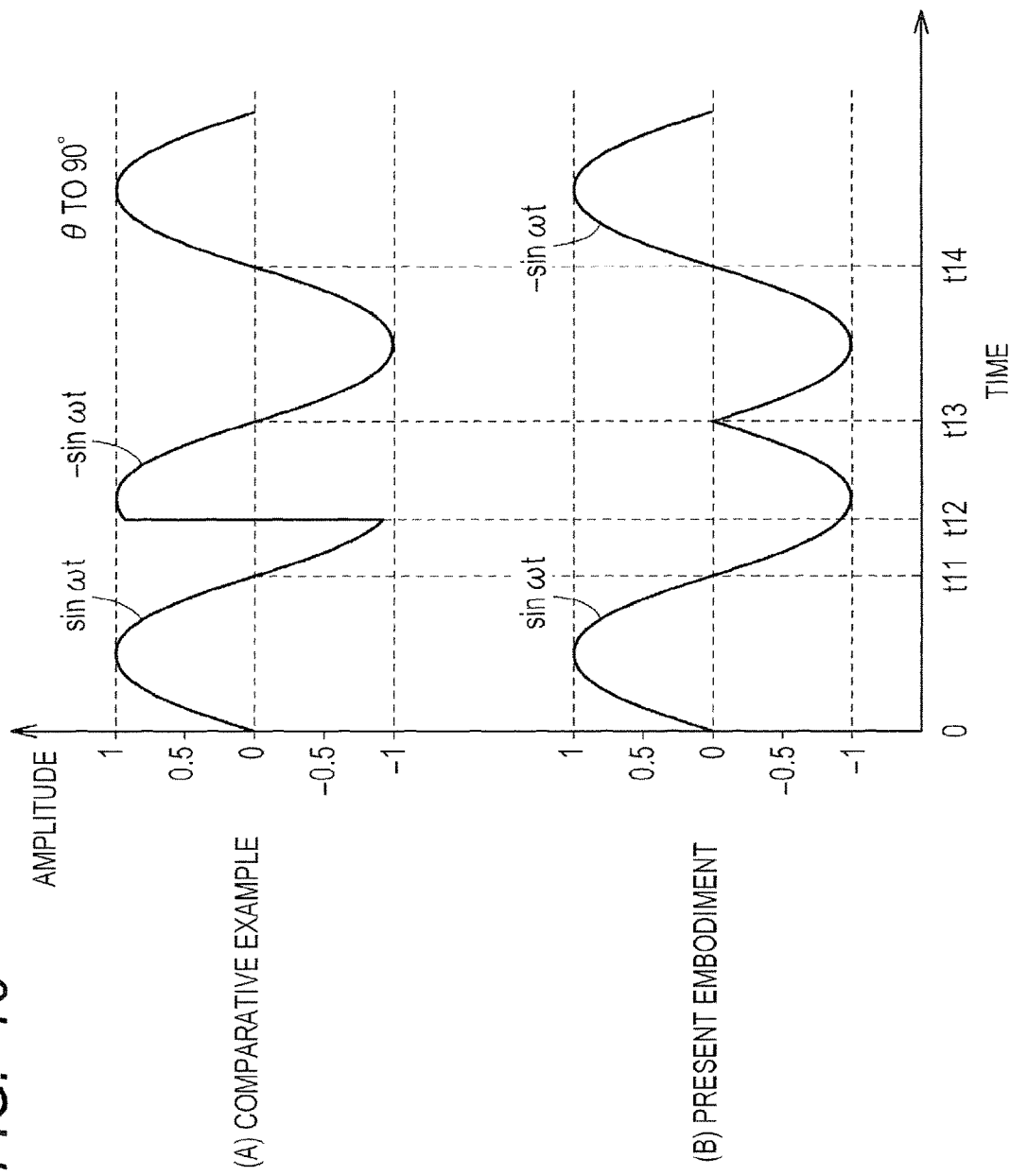
FIG. 16 shows waveforms of the sine wave signal SN2 which was output from an amplifier AMPa shown in FIG. 14.

FIG. 16 shows waveforms of the sine wave signal SN2 which was output from the amplifier AMPa, wherein waveform (A) represents a comparative example and waveform (B) represents the present embodiment. In FIG. 16, it is assumed that the excitation signal EX is sinωt and the electrical angle θ is approximately 90 degrees. In this case, the sine wave signal SN1 input to the R/D converter 10B is approximately equal to sinωt, and the cosine wave signal CS1 is approximately 0. Further, it is assumed that the electrical angle θ is slightly smaller than 90 degrees before time t12, and that the electrical angle θ is slightly greater than 90 degrees after time t12.

Waveform (A) is a comparative example of the sine wave signal SN2 input to the A/D converter 11 in this case. At time t12, the electrical angle θ passes through 90 degrees to move from the first quadrant to the second quadrant. Then, the sine wave signal SN2 is changed to the signal obtained by inverting the input sine wave signal SN1 after time t12. In this case, at the timing of switching at time t12, the sine wave signal SN2 significantly changes and noise occurs, which may result in an error in the finally calculated angle ϕ.

On the other hand, in the case of waveform (B) of the present embodiment, the timing of the switching of the switching circuit SWa is delayed until time t13 which is the zero crossing point of the excitation signal EX. For this reason, at the timing of switching at time t13, the sine wave signal SN2 is approximately 0 and significant signal change does not occur. As a result, it is possible to reduce the noise associated with the switching of the switching circuit SWa, and to reduce the angle conversion error.

Fourth Embodiment
Configuration and Operation

Figure 17:
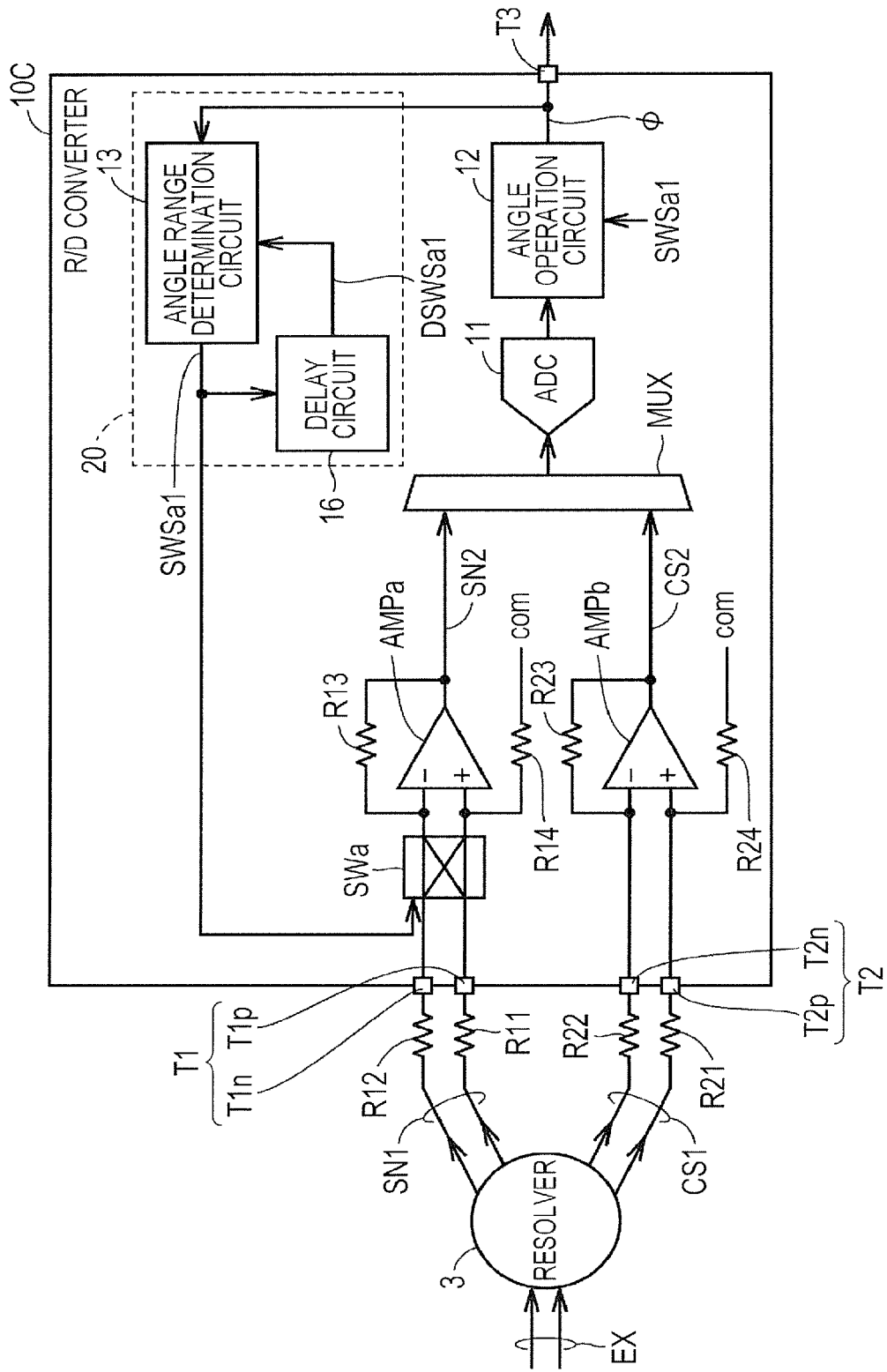
FIG. 17 is a block diagram showing the configuration of an R/D converter 10C according to a fourth embodiment.

FIG. 17 is a block diagram showing the configuration of an R/D converter 10C according to a fourth embodiment. The R/D converter 10C of FIG. 17 is different from the R/D converter 10 of the first embodiment in FIG. 1 in that a delay circuit 16 is further included. The delay circuit 16 includes a flip-flop, and the like. The delay circuit 16 generates and outputs a delayed switching signal DSWSa1. The delayed switching signal DSWSa1 is a signal obtained by delaying the switching signal SWSa output from the angle range determination circuit 13 by at least one cycle of clock.

Further, the R/D converter 10C of FIG. 17 is different from the R/D converter 10 of FIG. 1 with respect to the operation of the angle range determination circuit 13. The angle range determination circuit 13 of FIG. 17 generates the switching signal SWSa1 based on the angle ϕ that is calculated by the angle operation circuit 12, and on the delayed switching signal DSWSa1. In other words, the output of the angle range determination circuit 13 has a hysteresis effect that depends not only on the current angle ϕ but also on the logic level of the previous switching signal SWSa1.

The other points in FIG. 17 are the same as those in FIG. 1, so that like or corresponding parts are indicated by like reference numerals as used in FIG. 1 and the description thereof will not be repeated. Note that in the above configuration, the angle range determination circuit 13 and the delay circuit 16 configure the switch control circuit 20 that controls the timing of the switching of the switching circuit SWa.

FIG. 18 is a view of the relationship between the input and output values in a table format with respect to the angle range determination circuit 13 of FIG. 17. In FIG. 18, hys is the predetermined angle (for example, about several times the angle resolution) that indicates the width of the hysteresis.

Referring to FIG. 18, it is assumed that the switching signal SWSa1 at least before one cycle (namely, the delayed switching signal DSWSa1) is in the active state ("1"). In this case, even if the angle ϕ corresponds to the boundary of the first quadrant (0 to 90 degrees) and the third quadrant (180 to 270 degrees), the switching circuit SWa does not change to the non-inverted state. At the time when the angle ϕ further changes by the angle hys from the boundary of the first and third quadrants, the switching circuit SWa switches to the non-inverted state.

Similarly, it is assumed that the switching signal SWSa1 before at least one cycle (namely, the delayed switching signal DSWSa1) is in the inactive state ("0"). In this case, even if the angle ϕ corresponds to the boundary of the second quadrant (90 to 180 degrees) and the fourth quadrant (270 to 360 degrees), the switching circuit SWa does not change to the inverted state. At the time when the angle ϕ further changes by the angle hys from the boundary of the second and fourth quadrants, the switching circuit SWa switches to the inverted state.

The above can be restated as follows. It is assumed that the angle range determination circuit 13 detects that the sine wave signal SN1 and the cosine wave signal CS1, which are input to the respective input parts T1 and T2, change from the same phase to the reverse phase or from the reverse phase to the same phase, based on the calculated angle ϕ. In this case, the angle range determination circuit 13 switches between activation/inactivation of the switching signal SWSa at the timing when the calculated angle ϕ further changes by the predetermined angle hys, from the time when the same phase and the reverse phase are switched.

Effect

Figure 19:
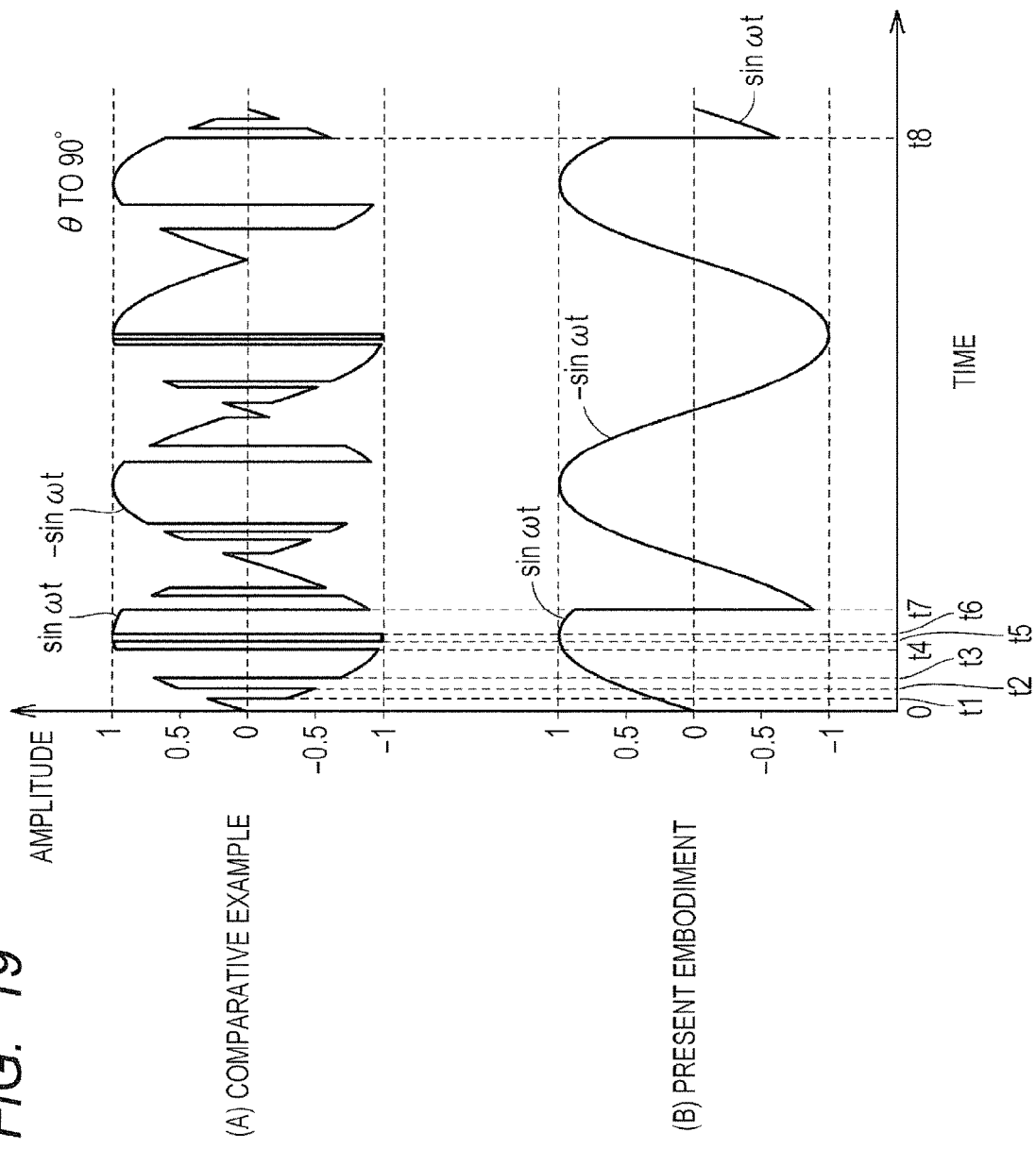
FIG. 19 shows waveforms of the sine wave signal SN2 which was output from the amplifier AMPa shown in FIG. 17.

FIG. 19 shows waveforms of the sine wave signal SN2 which was output from the amplifier AMPa of FIG. 17, wherein waveform (A) represents a comparative example and waveform (B) represents the present embodiment. In FIG. 19, it is assumed that the excitation signal EX is $\sin\omega t$ and the electrical angle $\theta$ is approximately 90 degrees. In this case, the sin wave signal SN1 input to the R/D converter 10B is approximately equal to $\sin\omega t$ and the cosine wave signal CS1 is approximately 0.

First, referring to waveform (A) of the comparative example, the electrical angle $\theta$ is slightly smaller than 90 degrees from time t0 to time t1. Then, the electrical angle $\theta$ is slightly greater than 90 degrees after time t1. Thus, the sine wave signal SN2 is inverted to $\sin\omega t$ at time t1. Further, the electrical angle $\theta$ is slightly greater than 90 degrees until the next time t2. Then, the electrical angle $\theta$ is slightly smaller than 90 degrees after time t2. Thus, the sine wave signal SN2 is inverted to $\sin\omega t$ at time t2. Similarly, the sine wave signal SN2 is inverted to $-\sin\omega t$ at time t3, $\sin\omega t$ at time t4, $-\sin\omega t$ at time t5, $\sin\omega t$ at time t6, and $-\sin\omega t$ at time t7. In this case, when the electrical angle $\theta$ fluctuates around 90 degrees, the switching circuit SWa switches frequently and the sine wave signal SN2 significantly changes every time the switching circuit SWa switches. The noise may occur due to the significant signal change, resulting in the angle conversion error.

On the other hand, in the case of waveform (B) of the present embodiment, when the electrical angle $\theta$ reaches the boundary between the first and second quadrants (or the boundary between the third and fourth quadrants), the sine wave signal SN2 is switched only when the detected angle $\phi$ further changes by the predetermined angle hys. More specifically, at the time when the electrical angle $\theta$ reaches 90 degrees plus hys at time t7, the sine wave signal SN2 is inverted to $\sin\omega t$. Further, at the time when the electrical angle $\theta$ reaches to 90 degrees minus hys at time t8, the sine wave signal SN2 is inverted to $\sin\omega t$. In this way, even if the electrical angle $\theta$ fluctuates around the 90 degrees, it is possible to reduce the number of times the switching circuit SWa switches. As a result, it is possible to reduce the occurrence of noise and to reduce the angle conversion error.

Fifth Embodiment

The first to fourth embodiments can be combined with each other. A fifth embodiment is a combination of the second to fourth embodiments.

Configuration and Operation

Figure 20:
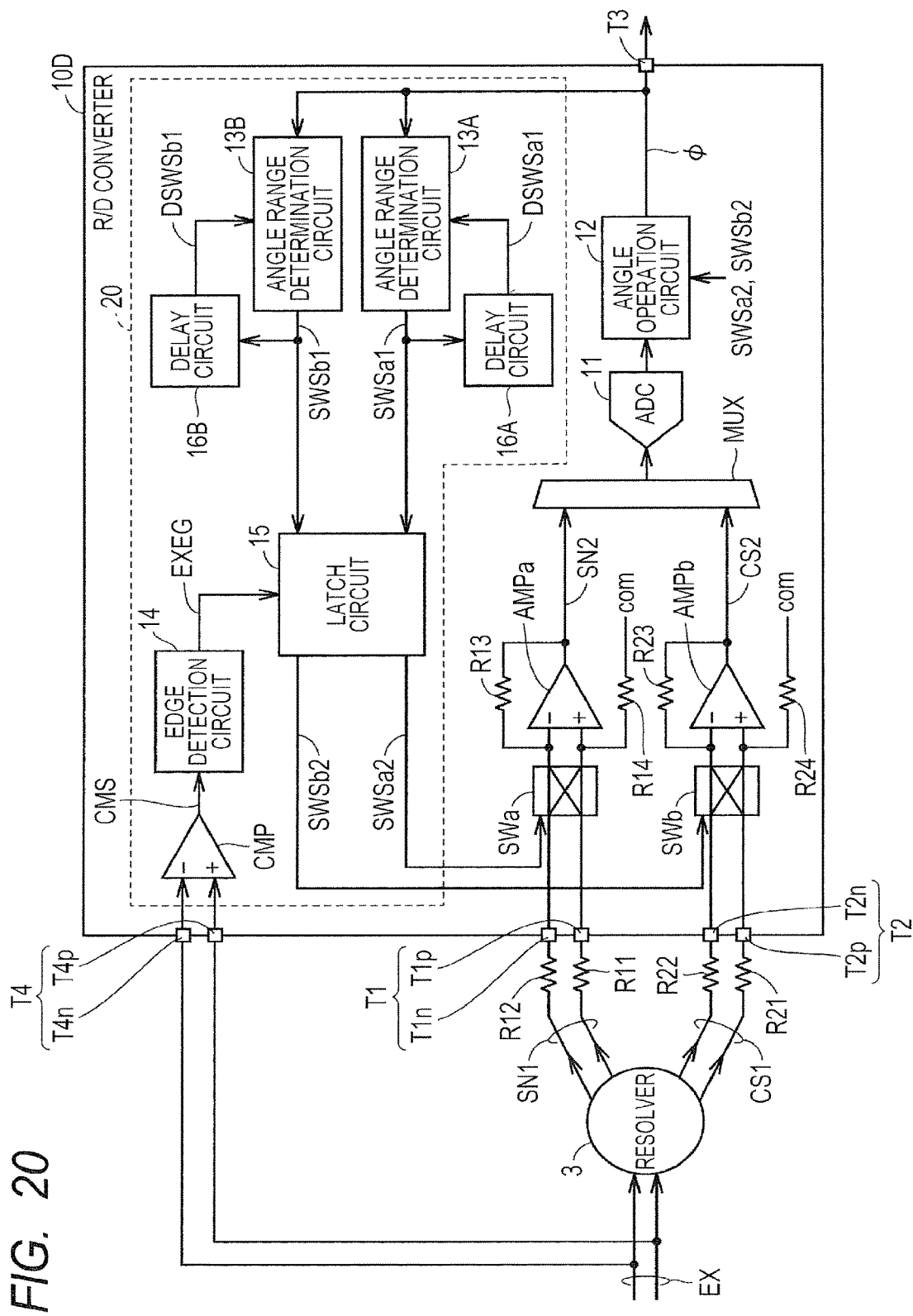
FIG. 20 is a block diagram showing the configuration of an R/D converter 10D according to a fifth embodiment.

FIG. 20 is a block diagram showing the configuration of an R/D converter 10D according to the fifth embodiment. The R/D converter 10D of FIG. 20 is different from the R/D converter 10A of the second embodiment described in FIG. 9, in that delay circuits 16A and 16B, the comparator CMP, the edge detection circuit 14, and the latch circuit 15 are further included.

The delay circuit 16A generates and outputs the delayed switching signal DSWSa1 as described in FIG. 17. The delayed switching signal DSWSa1 is a signal obtained by delaying the switching signal SWSa1, which is output from the angle range determination circuit 13A, by at least one cycle of clock. Similarly, the delay circuit 16B generates and outputs a delayed switching signal DSWSb1. The delayed switching signal DSWSb1 is a signal obtained by delaying the switching signal SWSb1, which is output from the angle range determination circuit 13B, by at least one cycle of clock.

As described in FIGS. 17 and 18, the angle range determination circuit 13A has a hysteresis effect. The angle range determination circuit 13A generates the switching signal SWSa1 based on the angle $\phi$ calculated by the angle operation circuit 12 and on the delayed switching signal DSWSa1. Similarly, the angle range determination circuit 13B generates the switching signal SWSb1 based on the angle $\phi$ calculated by the angle operation circuit 12 and on the delayed switching signal DSWSb1.

The comparator CMP and the edge detection circuit 14 are the same as those described in FIG. 14, so that the description thereof will not be repeated. As described in FIG. 14, the latch circuit 15 holds the switching signal SWSa1 output from the angle range determination circuit 13A. Then, the latch circuit 15 outputs the switching signal SWSa1 in synchronization with the timing of the activation of the excitation edge signal EXEG output from the edge detection circuit 14 (namely, in synchronization with the zero crossing point of the excitation signal EX). The switching circuit SWa switches between the inverted state and the non-inverted state in response to the switching signal SWSa2 output from the latch circuit 15. Similarly, the latch circuit 15 holds the switching signal SWSb1 output from the angle range determination circuit 13B. Then, the latch circuit 15 outputs the switching signal SWSa1 in synchronization with the timing of the activation of the excitation edge signal EXEG output from the edge detection circuit 14 (namely, in synchronization with the zero crossing point of the excitation signal EX). The switching circuit SWb switches between the inverted state and the non-inverted state in response to the switching signal SWSb2 output from the latch circuit 15.

Note that when the sine wave signal SN1 and the cosine wave signal CS1 are inverted based on the switching signals SWSa2 and SWSb2, the angle operation circuit 12 multiplies the sine wave signal SN1 and the cosine wave signal CN1 by minus one to return to their original values before inversion. Since the other configurations in FIG. 20 are the same as those in FIG. 1, like or corresponding parts are indicated by like reference numerals as used in FIG. 1 and the description thereof will not be repeated.

In the above configuration, the angle range determination circuits 13A and 13B, the comparator CMP, the edge detection circuit 14, the latch circuit 15, and the delay circuits 16A and 16B configure the switch control circuit 20 that controls the timing of the switching of the switching circuits SWa and SWb.

FIGS. 21A and 21B are views showing the relationship between the input and output values in a table format with respect to the angle range determination circuits 13A and 13B.

Referring to FIG. 21A, when the switching signal SWSa1 for the sine wave before at least one cycle (namely, the delayed switching signal DSWSa1) is in the active state ("1"), even if the angle $\phi$ corresponds to the boundary of the entire first and second quadrants (0 to 180 degrees), the switching signal SWSa1 does not change to the inactive state. The switching signal SWSa1 changes to the inactive state at the time when the angle $\phi$ further changes by the angle hys from the boundary of the entire first and second quadrants. After the switching signal SWSa1 changed to the inactive state, the switching circuit SWa changes from the inverted state to the non-inverted state at the timing of the zero crossing point of the excitation signal EX.

Similarly, when the switching signal SWSa1 for the sine wave before at least one cycle (namely, the delayed switching signal DSWSa1) is in the inactive state ("0"), even if the angle $\phi$ corresponds to the boundary of the entire third and fourth quadrants (180 to 360 degrees), the switching signal SWSa1 does not change to the active state. The switching signal SWSa1 changes to the active state at the time when the angle φ further changes by the angle hys from the boundary of the entire third and fourth quadrants. After the switching signal SWSa1 changed to the active state, the switching circuit SWa changes from. the non-inverted state to the inverted state at the timing of the zero crossing point of the excitation signal EX.

Referring to FIG. 21B, when the switching signal SWSb1 for the cosine wave before at least one cycle (namely, the delayed switching signal DSWSb1) is in the active state ("1"), even if the angle φ corresponds to the boundary of the entire fourth and first quadrants (270 to 90 degrees), the switching signal SWSb1 does not change to the inactive state. The switching signal SWSb1 changes to the inactive state at the time when the angle φ further changes by the angle hys from the entire fourth and first quadrants. After the switching signal SWSb1 changed to the inactive state, the switching circuit SWb changes from the inverted state to the non-inverted state at the timing of the zero crossing point of the excitation signal EX.

Similarly, when the switching signal SWSb1 for the cosine wave before at least one cycle (namely, the delayed switching signal DSWSb1) is in the inactive state ("0"), even if the angle φ corresponds to the boundary of the entire second and third quadrants (90 to 270 degrees), the switching signal SWSb1 does not change to the active state. The switching signal SWSb1 changes to the active state at the time when the angle φ further changes by the angle hys from the boundary of the entire second and third quadrants. After the switching signal SWSb1 changed to the active state, the switching circuit SWb changes from the non-inverted state to the inverted state at the timing of the zero crossing point of the excitation signal EX.

Effect

According to the R/D converter 10D of the fifth embodiment, it is possible to obtain about the same effect as those described in the first to fourth embodiments.

Sixth Embodiment

Figure 22:
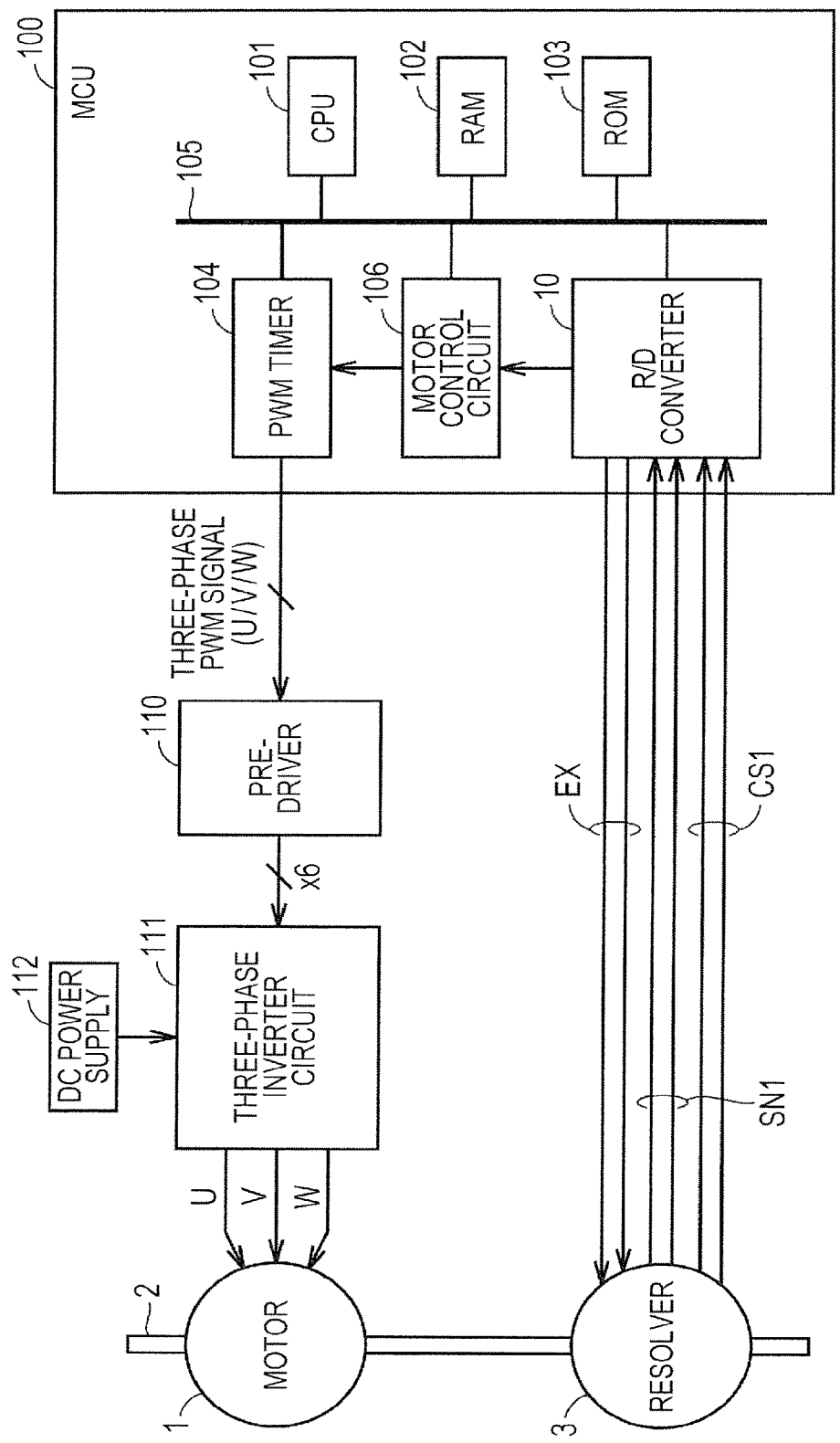
FIG. 22 is a block diagram showing the configuration of a motor control device.

FIG. 22 is a block diagram showing the configuration of a motor control device. When a synchronous motor 1 of FIG. 22 is used in harsh environments, such as for industrial machinery or vehicle power system motors, the resolver 3 is often used as a sensor for detecting the angle of a rotational axis 2 of the synchronous motor 1. The motor control device controls the rotary drive of the synchronous motor 1 based on the detected value of the resolver 3.

Referring to FIG. 22, the motor control device includes a micro controller unit (MCU) 100, a pre-driver 110, and a three-phase inverter circuit 111.

The micro controller unit 100 includes a central processing unit (CPU) 101, a random access memory (RAM) 102, a read only memory (ROM) 103, a PWM timer 104, a motor control circuit 106, the R/D converter 10 described in the first to fifth embodiments, and a bus 105 for coupling each of the components. The excitation signal EX is output to the resolver 3 from the R/D converter 10. Then, the sine wave signal SN1 and the cosine wave signal CS1 are input to the R/D converter 10 from the resolver 3.

The CPU 101 controls the entire MCU 100 by executing a control program stored in advance in the ROM 103. The RAM 102 is used as a work memory of the CPU 101. An electrically rewritable memory, such as a flash memory, can be used as the ROM 103. The motor control circuit 106 receives the angle φ output from the R/D converter 10, and performs various processes for the feedback control of the motor based on the angle φ. The PWM timer 104 receives the control signal from the motor control circuit 106, and outputs a three-phase pulse width modulation (PWM) signal for controlling the U/V/W phases of the synchronous motor 1. Control registers are provided in each of the R/D converter 10, the motor control circuit 106, and the PWM timer to control them by themselves. Then, the CPU 101 sets values to the respective control registers through the bus 105.

The pre-driver 110 generates and outputs a gate control signal for controlling the open and close of six switching elements (for example, insulated gate bipolar transistors (IGBT)), not shown, that configure the three-phase inverter circuit 111.

The three-phase inverter circuit 111 converts the DC voltage from a DC power supply 112 into a three-phase voltage (motor drive voltage) based on the gate control signal output from the pre-driver 110. The three-phase inverter circuit 111 drives the motor by supplying the DC voltage of each phase to each phase winding.

In the motor control device described above, it is possible to detect the rotation angle of the synchronous motor 1 with high accuracy by using any of the R/D converts 10, 10A to 10D described in the first to fifth embodiments. Thus, it is possible to control the motor with high accuracy based on the detected rotation angle.

The invention made by the present inventors has been concretely described based on the embodiments. However, it is needless to say that the present invention is not limited to the above embodiments and various modifications and alterations can be made within the scope of the present invention.

What is claimed is:

1. A semiconductor device comprising:
   a first input part to which a first signal indicating the sine of an angle to be detected is input;
   a second input part to which a second signal indicating the cosine of the angle is input;
   a multiplexer for selecting one of the first and second signals;
   an analog to digital converter for converting the output signal of the multiplexer into a digital value; and
   a switching circuit coupled between at least one of the first and second input parts and the multiplexer,
   wherein the switching circuit is configured to be able to invert the input first or second signal,
   wherein the semiconductor device further comprises
      an angle operation circuit for calculating the angle based on the first and second signals converted into digital values by the analog to digital converter, and
      a switch control circuit for controlling the switching of the switching circuit based on the angle calculated by the angle operation circuit,
   wherein the first signal is a signal obtained by modulating an excitation signal, which is input to a resolver, by the sine of the angle,
   wherein the second signal is a signal obtained by modulating the excitation signal by the cosine of the angle,
   wherein the switch control circuit is configured to invert the input first or second signal in such a way that the first and second signals to be input to the analog to digital converter have the same phase,
   wherein the semiconductor device comprises, as the switching circuit:
   a first switching circuit coupled between the first input part and the multiplexer; and a second switching circuit coupled between the second input part and the multiplexer, and wherein the switch control circuit is configured to perform the steps of:

inverting the first signal by the first switching circuit when the calculated angle is 180 degrees or more and 360 degrees or less; and inverting the second signal by the second switching circuit when the calculated angle is 90 degrees or more and 270 degrees or less.

2. A semiconductor device comprising:

a first input part to which a first signal indicating the sine of an angle to be detected is input;

a second input part to which a second signal indicating the cosine of the angle is input;

a multiplexer for selecting one of the first and second signals;

an analog to digital converter for converting the output signal of the multiplexer into a digital value; and a switching circuit coupled between at least one of the first and second input parts and the multiplexer, wherein the switching circuit is configured to be able to invert the input first or second signal, wherein the semiconductor device further comprises an angle operation circuit for calculating the angle based on the first and second signals converted into digital values by the analog to digital converter, and a switch control circuit for controlling the switching of the switching circuit based on the angle calculated by the angle operation circuit, wherein the first signal is a signal obtained by modulating an excitation signal, which is input to a resolver, by the sine of the angle, wherein the second signal is a signal obtained by modulating the excitation signal by the cosine of the angle, wherein the switch control circuit is configured to invert the input first or second signal in such a way that the first and second signals to be input to the analog to digital converter have the same phase, wherein the semiconductor device comprises, as the switching circuit:

a first switching circuit coupled between the first input part and the multiplexer; and a second switching circuit coupled between the second input part and the multiplexer, and wherein the switch control circuit is configured to perform the steps of:

inverting the first signal by the first switching circuit when the calculated angle is 0 degrees or more and 90 degrees or less; and inverting the second signal by the second switching circuit when the calculated angle is 0 degrees or more and 90 degrees or less, or is 270 degrees or more and 360 degrees or less.

* * * * *